United States Patent
Chiba et al.

(10) Patent No.: US 10,809,769 B2
(45) Date of Patent: Oct. 20, 2020

(54) ELECTRONIC DEVICE AND WATERPROOF CASE

(71) Applicant: CASIO COMPUTER CO., LTD., Shibuya-ku, Tokyo (JP)

(72) Inventors: Yasunori Chiba, Tachikawa (JP); Yasunori Usui, Mitaka (JP); Gu Dong, Hachioji (JP)

(73) Assignee: CASIO COMPUTER CO., LTD., Tokyo (JP)

(*) Notice: Subject to any disclaimer, the term of this patent is extended or adjusted under 35 U.S.C. 154(b) by 0 days.

(21) Appl. No.: 16/672,380

(22) Filed: Nov. 1, 2019

(65) Prior Publication Data
US 2020/0142451 A1 May 7, 2020

(30) Foreign Application Priority Data
Nov. 5, 2018 (JP) .................. 2018-208390

(51) Int. Cl.
*G06F 1/16* (2006.01)
*H05K 5/00* (2006.01)
*H05K 5/02* (2006.01)

(52) U.S. Cl.
CPC ......... *G06F 1/1656* (2013.01); *H05K 5/0004* (2013.01); *H05K 5/0086* (2013.01); *H05K 5/0217* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,941,196 B2* | 5/2011 | Kawasaki | ............ | H04B 1/3888 379/428.01 |
| 8,424,926 B2* | 4/2013 | Ueno | ................... | H04M 1/0249 292/58 |
| 8,481,200 B2* | 7/2013 | Ren | ......................... | G03B 17/02 361/679.01 |
| 8,828,572 B2* | 9/2014 | Ishida | .................. | H01M 2/1066 429/100 |
| 8,917,496 B2* | 12/2014 | Richardson | ........... | G06F 1/1626 361/679.01 |
| 10,084,165 B2* | 9/2018 | Fukushima | ......... | H01M 2/1066 |
| 10,469,638 B2* | 11/2019 | Chiba | ................. | H01M 2/1094 |
| 10,470,326 B2* | 11/2019 | Meguro | ............... | H05K 5/0217 |
| 2012/0045679 A1 | 2/2012 | Ishida | | |
| 2012/0162881 A1* | 6/2012 | Usui | ................... | H01M 2/1066 361/679.01 |
| 2013/0271902 A1* | 10/2013 | Lai | ......................... | H04R 1/02 361/679.01 |

FOREIGN PATENT DOCUMENTS

JP 2010268282 A 11/2010

* cited by examiner

*Primary Examiner* — Lisa Lea-Edmonds
(74) *Attorney, Agent, or Firm* — Holtz, Holtz & Volek PC

(57) ABSTRACT

An electronic device includes:
a first case provided with an opening portion;
a second case that has one end portion provided with a fulcrum portion engaged with the first case and rotates about the fulcrum portion to close the opening portion in an openable manner, and
a packing portion that is provided to be inclined to be more on an inner side of the second case at a portion closer to the fulcrum portion of the second case, and comes into pressure contact with an edge portion of the opening portion when the second case closes the opening portion.

10 Claims, 18 Drawing Sheets

ELECTRONIC DEVICE AND WATERPROOF CASE

1. TECHNICAL FIELD

The present invention relates to an electronic device and a waterproof case.

2. RELATED ART

For example, a portable terminal with the following structure, as described in JP 2010-268282 A, has been known. Specifically, when a battery container portion provided to a case is closed by a battery cover, the battery cover closes the battery container portion in an openable manner, by being rotated about a fulcrum protrusion, provided to one end portion of the battery cover and inserted in an engagement recess of the case.

In this type of portable terminal, when the battery cover covers and thus closes the battery container portion, a packing provided on the battery cover surrounds the outer circumference of the opening portion of the battery housing portion and comes into pressure contact with an edge portion of the opening portion. Thus, the battery container portion is waterproofed.

However, in such a portable terminal, since the packing of the battery cover is disposed over substantially the same plane, when the battery cover is rotated about the fulcrum protrusion inserted in the engagement recess to close the battery storage portion, the entire packing is substantially simultaneously pressed against the opening portion of the battery container portion. Thus, strong pressing force is required, meaning that operability of a closing operation of the battery cover is low.

SUMMARY

To solve the above problem, an electronic device according to the present invention includes:

a first case provided with an opening portion;

a second case that has one end portion provided with a fulcrum portion engaged with the first case and rotates about the fulcrum portion to close the opening portion in an openable manner, and a packing portion that is provided to be inclined to be more on an inner side of the second case at a portion closer to the fulcrum portion of the second case, and comes into pressure contact with an edge portion of the opening portion when the second case closes the opening portion.

DETAILED DESCRIPTION

Hereinafter, an embodiment of a portable terminal to which the present invention is applied will be described with reference to FIGS. 1 to 18.

Figure 1:
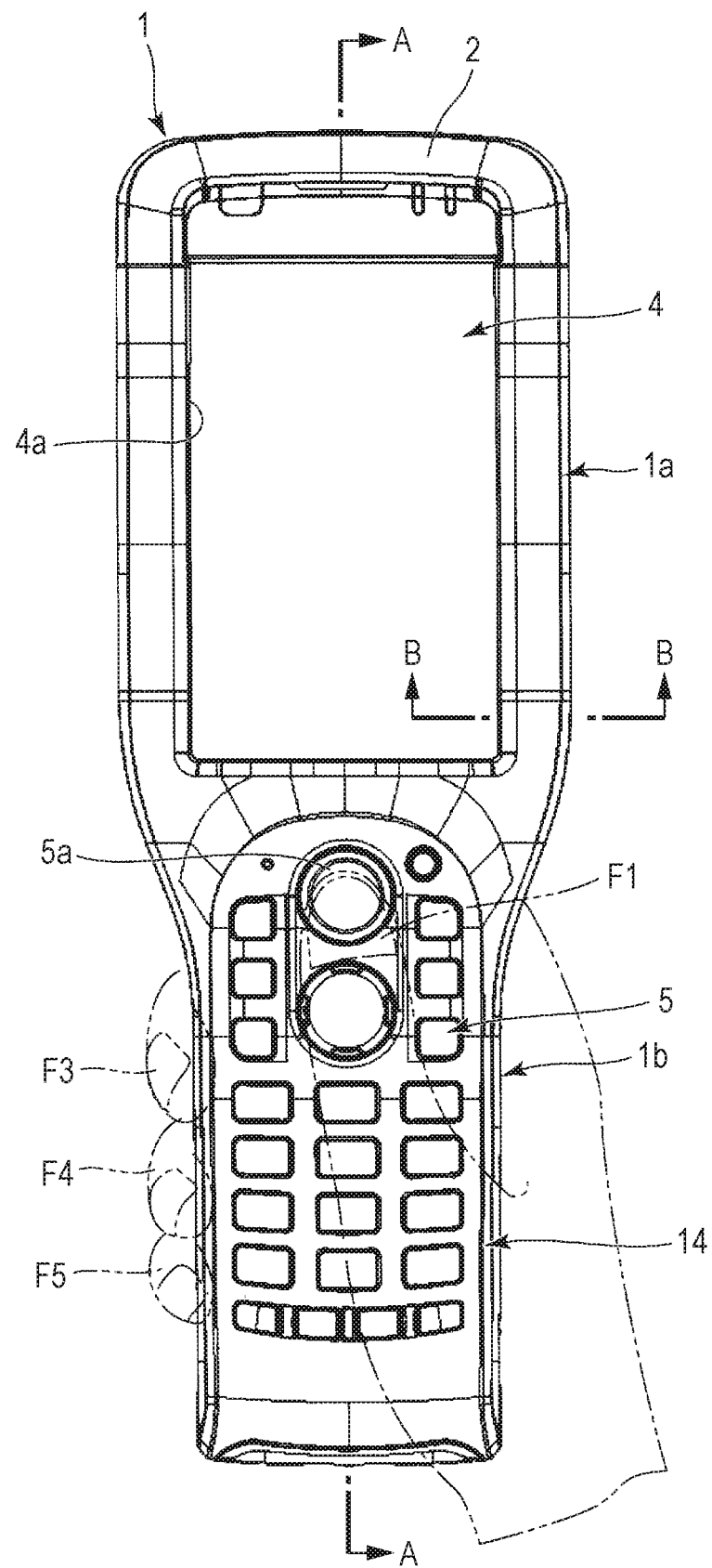
FIG. 1 is a front view showing an embodiment in which the present invention is applied to a portable terminal.
Figure 2:
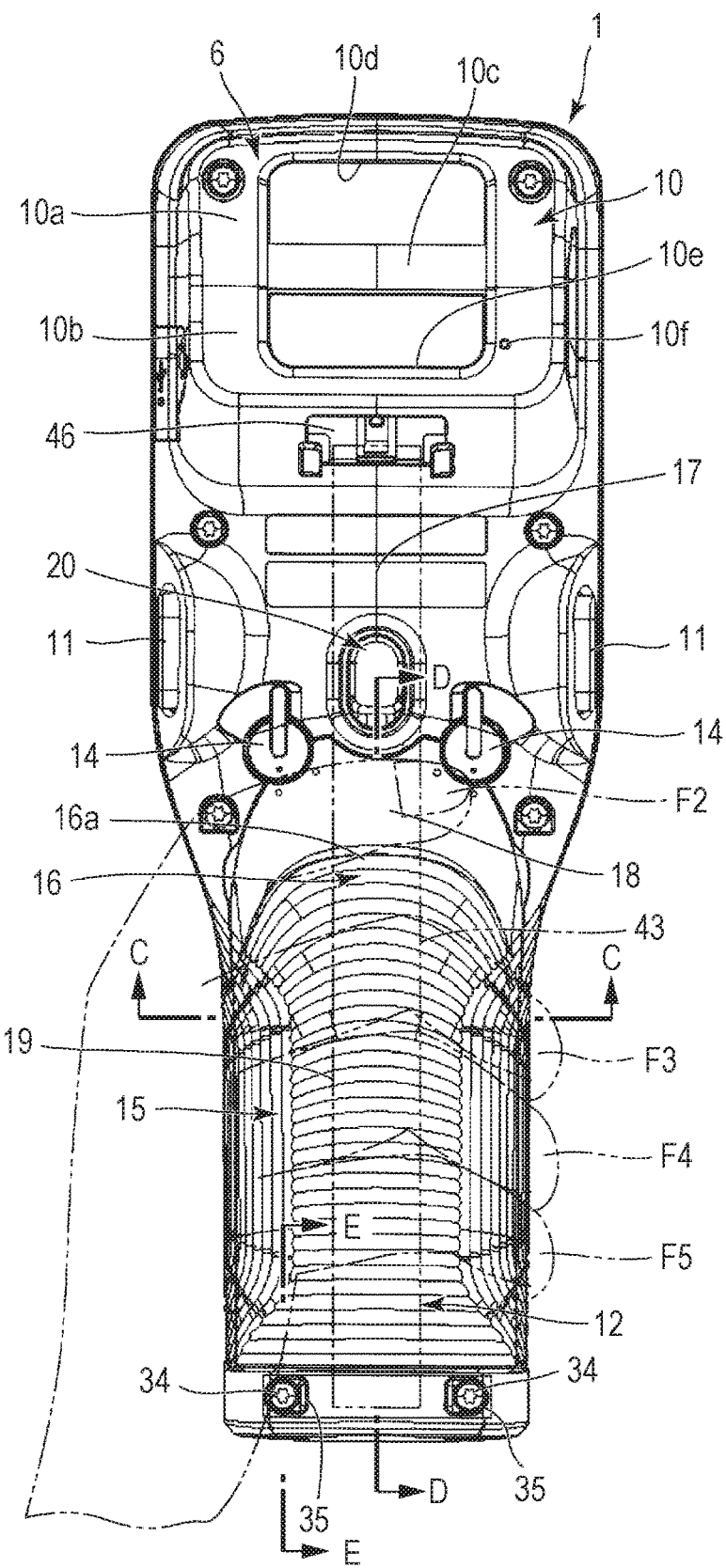
FIG. 2 is a back view of the portable terminal illustrated in FIG. 1.
Figure 3:
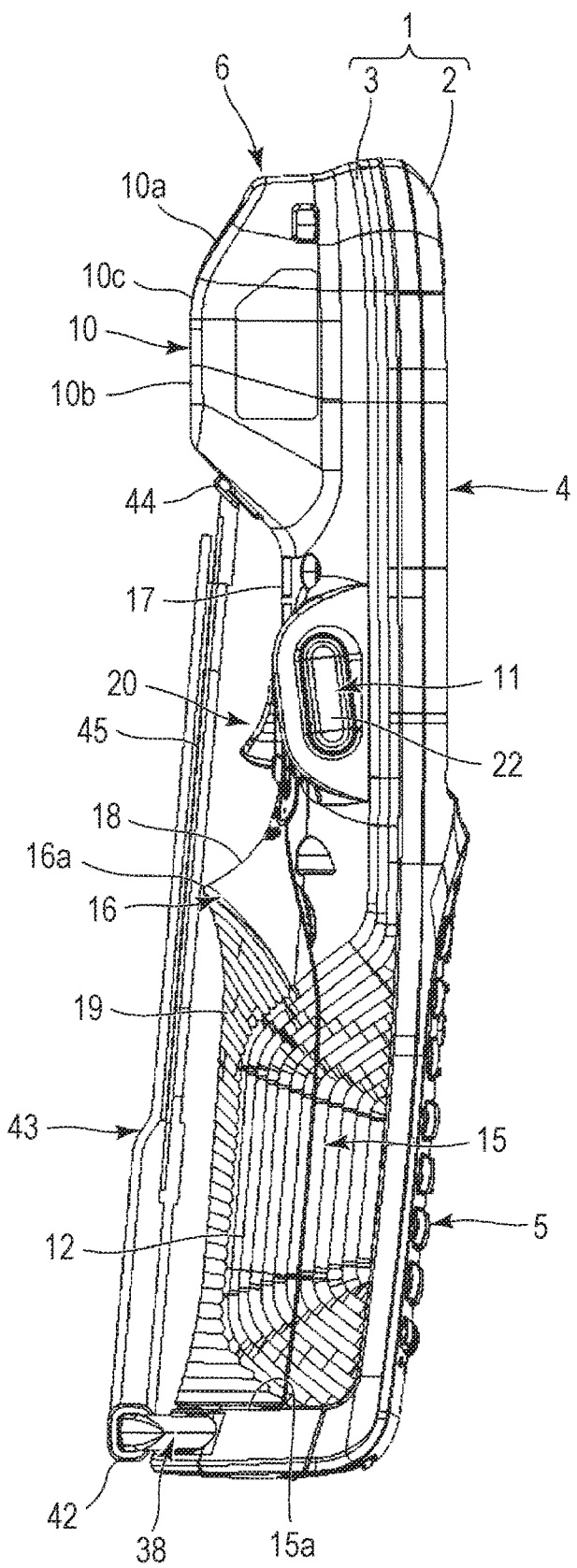
FIG. 3 is a side view of the portable terminal illustrated in FIG. 1 as viewed from the left side.

As illustrated in FIGS. 1 to 3, the portable terminal includes a device case 1 that is a terminal body. The device case 1 is formed to have a substantially rectangular shape that is long in a vertical direction (an upper and lower direction in FIG. 1).

As illustrated in FIG. 1 to FIG. 3, the device case 1 is formed to have a substantially upper half formed to be a wide portion 1a and a substantially lower half formed to be a narrow portion 1b, and thus is formed to have a substantially paddle shape as a whole. Specifically, the wide portion 1a on the upper side is formed to have a length (width), in a lateral direction (a left and right direction in FIG. 1) orthogonal to the vertical direction, longer (wider) than a length (width) of the narrow portion 1b on the lower side in the lateral direction (the left and right direction in FIG. 1).

Furthermore, as illustrated in FIGS. 1 to 5, the device case 1 is configured to have an upper case 2, a lower case 3 (first case), and a module (not illustrated) incorporated in these. As illustrated in FIGS. 1 and 3, the upper case 2 is similar to the device case 1 in that it has a wide portion on the upper side and a narrow portion on the lower side to have a substantially paddle shape, and has a side surface portion on the outer circumference configured to be attached to the lower case 3.

Figure 4:
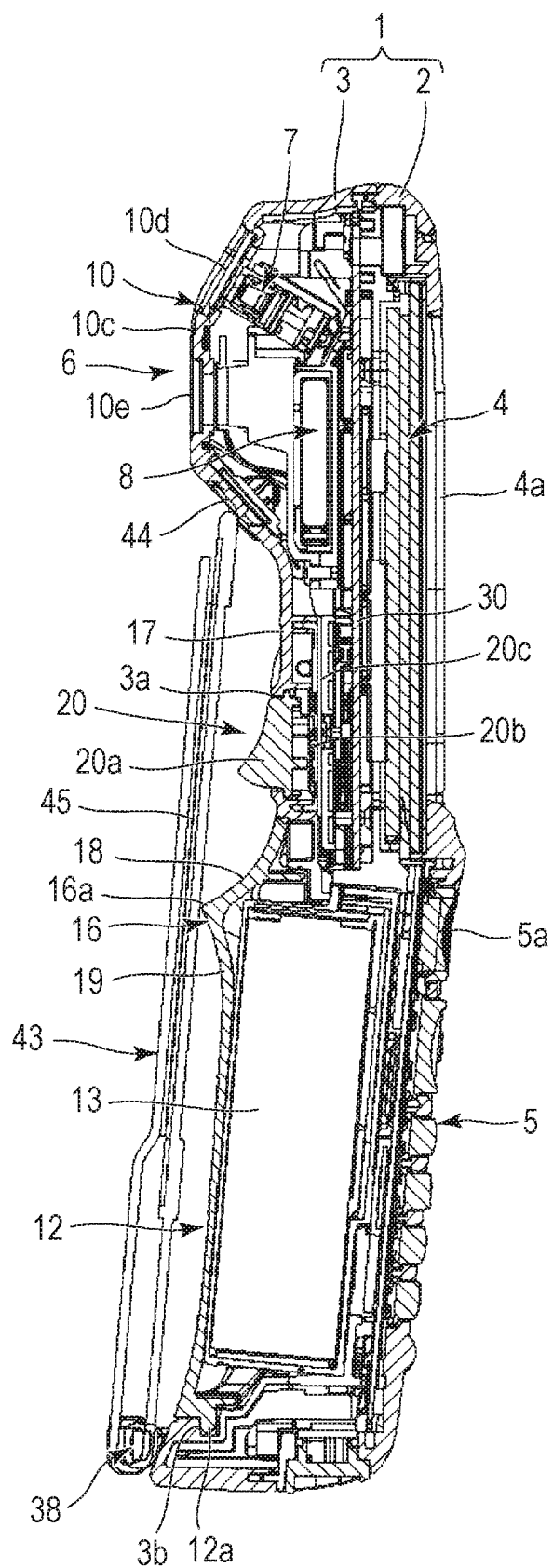
FIG. 4 is a cross-sectional view of the portable terminal illustrated in FIG. 1 taken along a line indicated by arrows A-A.

In this case, as illustrated in FIGS. 1 and 4, a display portion 4 is provided entirely over the wide portion on the upper side of a front surface, which is an upper surface of the upper case 2. Furthermore, a key operation portion 5 is provided substantially entirely over the narrow portion on the lower side of the front surface of the upper case 2. The display portion 4 is a flat display panel such as a liquid crystal display panel or an electroluminescence (EL) display panel, and is formed to have a substantially rectangular shape.

As illustrated in FIGS. 1 and 4, the display portion 4 is configured to be arranged in the upper case 2 while being in a state of corresponding to a display window portion 4a provided on the front surface of the upper case 2, so that information displayed can be seen in a top view of the upper case 2 through the display window portion 4a. The key operation portion 5 includes various keys necessary for a portable terminal such as a numeric keypad, a cursor key, and a function key. In this case, the key operation portion 5 has, in the middle part on its upper side, an upper surface trigger key 5a.

Further, as illustrated in FIGS. 3 and 4, the upper case 2 has a shape with the front surface (upper surface) of the narrow portion on the lower side slightly inclined downward from the upper side toward the lower side, relative to the front surface (upper surface) of the wide portion on the upper side. Thus, the upper case 2 is formed to have a shape with the side of the key operation portion 5 on the lower side inclined to be slightly lowered with respect to an extension line of a display surface of the display portion 4 on the upper side. Thus, the upper case 2 is configured to enable a user to easily see the display portion 4 while operating the key operation portion 5.

As illustrated in FIGS. 2 to 5, the lower case 3 is similar to the upper case 2 in that it has a wide portion on the upper side and a narrow portion on the lower side to have a substantially paddle shape, and has a side surface portion on the outer circumference configured to be attached to the upper case 2. An optical reading unit 6 is provided on a back surface (a lower surface) of the wide portion located on the upper portion side of the lower case 3.

As illustrated in FIGS. 2 to 5, the optical reading unit 6 includes a laser reading unit 7 and an image capturing unit 8 which are contained in an optical container portion 10 that is an arrangement portion provided to protrude, to be in a box shape, on the back surface, and is positioned on the upper portion side in the wide portion of the lower case 3. The optical container portion 10 includes a first surface 10a on the upper side on the back surface, a second surface 10b on the lower side on the back surface, and a boundary portion 10c located at the boundary between these.

In this case, as illustrated in FIGS. 2 to 5, the first surface 10a on the upper side is formed as an inclined surface that is largely inclined from the boundary portion 10c toward the upper side. The second surface 10b on the lower side is formed as an inclined surface that is gently inclined from the boundary portion 10c toward the lower side. Thus, the second surface 10b on the lower side is a planer region that has a smaller inclination angle than the first surface 10a on the upper side and is formed to be substantially parallel to the display surface of the display portion 4 of the upper case 2.

Furthermore, as illustrated in FIGS. 2 to 5, the first surface 10a on the upper side is provided with a first window portion 10d corresponding to the laser reading unit 7 provided in the optical container portion 10. The second surface 10b on the lower side is provided with a second window portion 10e corresponding to the image capturing unit 8 provided in the optical container portion 10.

Figure 17:
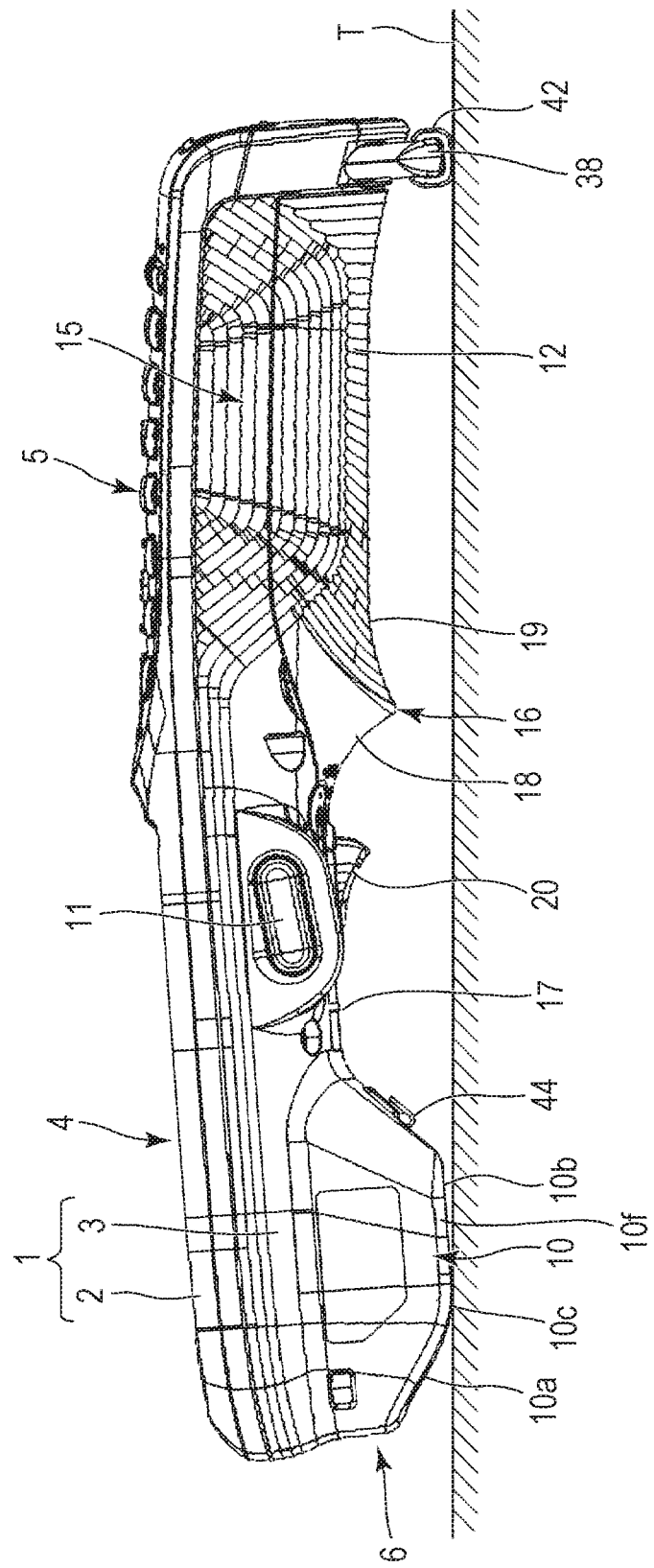
FIG. 17 is a side view illustrating a state in which the lower case is placed on the placement surface such as a tabletop, with a hand belt removed from the portable terminal illustrated in FIG. 3.
Figure 18:
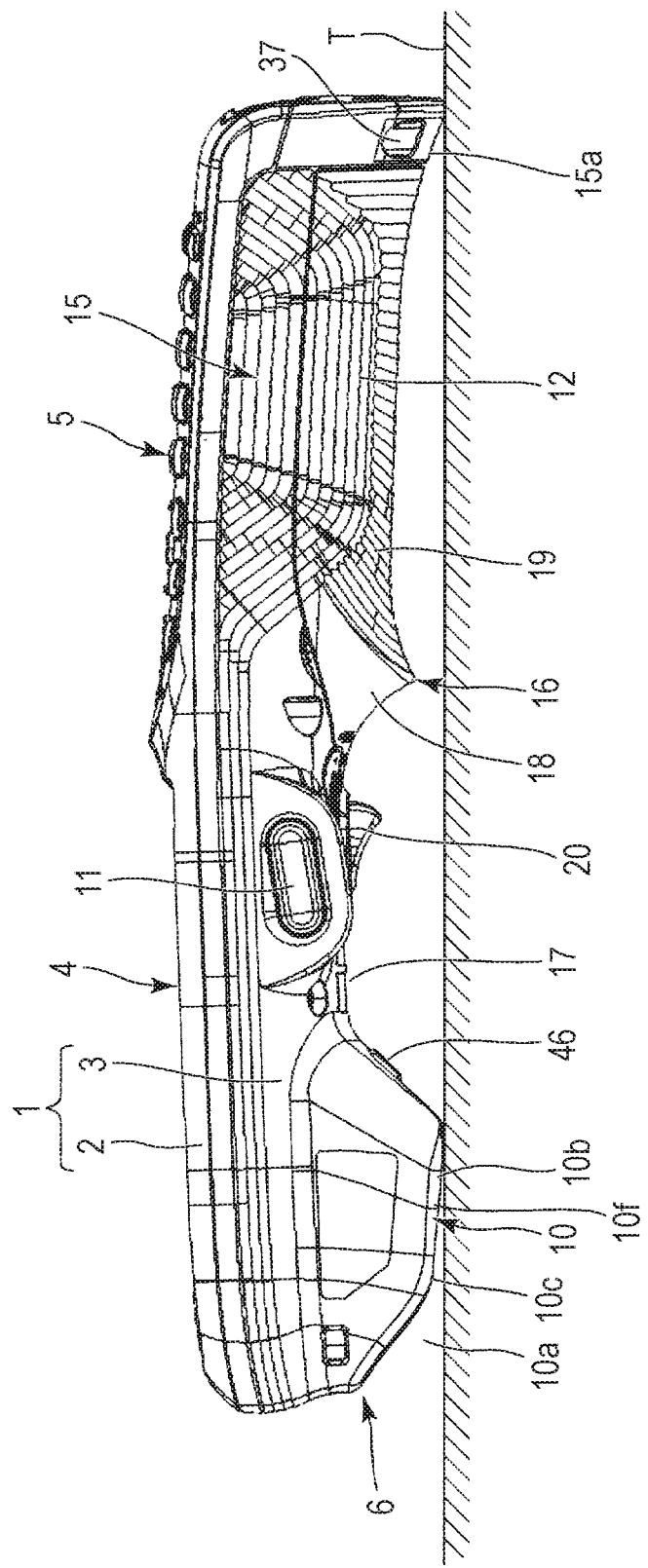
FIG. 18 is a side view illustrating a state in which the lower case is placed on the placement surface such as a tabletop, with the hand belt and the leg portion removed from the portable terminal illustrated in FIG. 3.

As illustrated in FIG. 2, the second surface 10b on the lower side is provided with either a microphone sound collection hole 10f or a speaker sound emission hole arranged outside of a region of the second window portion 10e. In this case, the second surface 10b has a reference portion provided in the region including the sound collection hole 10f or the sound emission hole. The reference portion is a contactless portion that does not come into contact with a placement surface T such as a tabletop when the lower case 3 is placed on the placement surface T, as illustrated in FIGS. 17 and 18.

Thus, as illustrated in FIGS. 2 to 5, the optical reading unit 6 reads a barcode of an item and the like, with the laser reading unit 7 emitting a laser beam to the outside of the device case 1 through the first window portion 10d of the first surface 10a of the optical container portion 10, and reading reflected light of this laser beam. Furthermore, the optical reading unit 6 is configured such that the image capturing unit 8 captures an image of an item that is the target of the reading by the laser reading unit 7, through the second window portion 10e of the second surface 10b.

As illustrated in FIGS. 1 to 4, side surface trigger keys 11, described later, are provided on respective both side portions, of the wide portion 1a, and are positioned at a substantially middle portion in the vertical direction (longitudinal direction) of the device case 1, that is, on both side portions of the wide portion 1a at the boundary portion between the wide portion 1a and the narrow portion 1b. The side surface trigger keys 11 and the upper surface trigger key 5a of the key operation portion 5 are for causing the optical reading unit 6 to perform the reading operation.

Furthermore, the narrow portion 1b located on the lower portion side of the device case 1 is provided with a battery container portion 13 that is covered with a battery cover 12 and corresponds to the key operation portion 5 as illustrated in FIGS. 2 to 5. This battery container portion 13 stores a rechargeable battery (not illustrated), is provided in the narrow portion 1b of the device case 1 in a state of corresponding to the key operation portion 5 provided in the narrow portion 1b of the device case 1, and is open on the back surface side through an opening portion 13a provided on the back surface of the device case 1.

Figure 12:
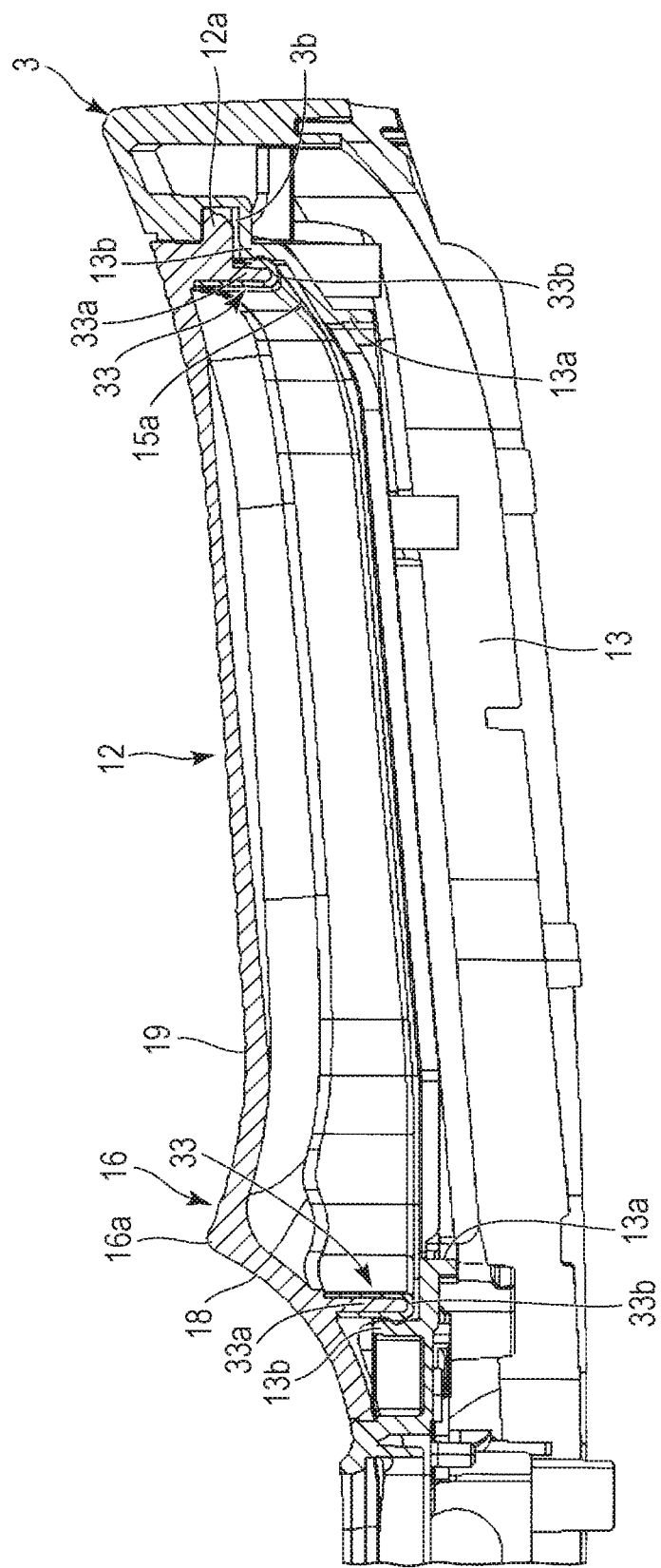
FIG. 12 is an enlarged cross-sectional view of a main part of the grip portion of the portable terminal illustrated in FIG. 2 taken along a line indicated by arrows D-D.

As illustrated in FIG. 4 and FIG. 12, the battery cover 12 (second case) is provided with a fulcrum protrusion portion 12a in an end portion on a lower portion side. The fulcrum protrusion portion 12a has a structure to be detachably inserted and locked in a locking portion 3b (locking recess) located in the battery container portion 13 and provided in the lower case 3. Thus, the battery cover 12 is configured to rotate about the fulcrum protrusion portion 12a locked in the locking portion 3b of the lower case 3 so that the battery container portion 13 is opened and closed.

In this case, as illustrated in FIGS. 2 and 4, the back surface of the lower case 3 located between the battery container portion 13 and the optical reading unit 6 is provided with a pair of attachment levers 14 for detachably fixing the battery cover 12, closing the opening portion 13a of the battery container portion 13, to the lower case 3. In other words, the pair of attachment levers 14 are provided in the vicinity of the side surface trigger keys 11 in the both side portions of the device case 1.

As illustrated in FIGS. 2 to 5, this pair of attachment levers 14 are operated to rotate so that an edge portion of the upper portion of the battery cover 12 is detachably locked to the back surface of the lower case 3. Thus, the battery cover 12 is configured to be attached to the back surface of the lower case 3 in a state of corresponding to the key operation portion 5 with the edge portion of the upper portion locked by the pair of attachment levers 14, while covering the opening portion 13a of the battery container portion 13 in an openable manner.

As illustrated in FIGS. 1 to 3, the narrow portion 1b located on the lower portion side of the device case 1 is provided with a grip portion 15 that can be gripped by one of the hands of the user. The grip portion 15 is provided over the front surface that is a first surface of the device case 1 and the back surface that is a second surface located on the opposite side. The grip portion 15 is configured to be capable of being held with one of the hands of the user, in a gripping mode in which a thumb F1 of the one hand of the user is provided over the front surface of the device case 1 and other fingers F2 to F5 extending from the side of the device case 1 support the back surface of the device case 1.

Specifically, as illustrated in FIGS. 1 to 3, the grip portion 15 includes the narrow portion of the upper case 2, which is the narrow portion 1b of the device case 1, the narrow portion of the lower case 3, and the battery cover 12 of the lower case 3. The side surface portions of the narrow portion of the upper case 2 in the grip portion 15 and the narrow portion of the lower case 3 are formed to have curved surfaces in an arced form, so that the hand of the user gripping the grip portion 15 in the gripping mode described above is naturally bent. In addition, the battery cover 12 of the lower case 3 has a curved shape that is gently curved from both side portions of the lower case 3 toward the back surface side to be in a protruding form.

Thus, as illustrated in FIGS. 1 to 3, the grip portion 15 allows the other fingers F2 to F5 of the user to naturally bend around the back surface of the device case 1, in the gripping mode in which the thumb F1 of the user is provided over the front surface of the device case 1 for operating the key operation portion 5 using the thumb F1 while the other fingers F2 to F5 extending from the side of the device case 1 support the back surface of the device case 1.

Thus, as illustrated in FIGS. 1 to 3, the grip portion 15 allows the gripping hand of the user which is one of the hands gripping the device case 1 to fit so that the user can hold the device case 1 with one hand regardless of the size of the user's hand, when the user holds the device case 1 with one of the hands, in the gripping mode in which the thumb F1 of the user is provided over the front surface of the device case 1 for operating the key operation portion 5 using the thumb F1 while the other fingers F2 to F5 extending from the side of the device case 1 support the back surface of the device case 1.

Furthermore, in the grip portion 15, the battery cover 12 located on the back surface is provided with a finger resting projection portion 16 having a shape to bulge between the index finger F2 and the middle finger F3 of the gripping hand of the user, when the user holds the device case 1 with one of the hands, in the gripping mode in which the thumb F1 of the user is provided over the front surface of the device case 1 while the other fingers F2 to F5 extending from the side of the device case 1 support the back surface of the device case 1 as illustrated in FIGS. 2 to 4.

In this configuration, as illustrated in FIG. 2 to FIG. 4, the back surface of the device case 1 is provided with a scalloped portion 17 as a recess between the grip portion 15 and the other end portion side of the device case 1 positioned on the extension of the grip portion 15. Specifically, the scalloped portion 17 is provided as a recess between the finger resting projection portion 16 of the battery cover 12 and the optical container portion 10 of the optical reading unit 6.

As illustrated in FIGS. 2 to 4, the finger resting projection portion 16 has a top portion 16a in a chevron form to be positioned between the index finger F2 and the middle finger F3 of the gripping hand of the user, when the user holds the grip portion 15 with one of the hands, in the gripping mode in which the thumb F1 of the user is provided over the key operation portion 5 for operating the key operation portion 5 with the thumb F1 and the other fingers F2 to F5 extending from the side of the device case 1 support the back surface of the device case 1. The top portion 16a is formed to be positioned between the index finger F2 and the middle finger F3 of the gripping hand of the user, and to be continuously curved along the bent shape of the index finger F2 and the middle finger F3.

Specifically, as illustrated in FIGS. 2 to 4, the top portion 16a is continuously curved along the bent shape of the index finger F2 and the middle finger F3 in the lateral direction orthogonal to the longitudinal direction of the device case 1, with an intermediate portion in the continuous lateral direction having the largest protrusion length toward the back surface side in the thickness direction of the device case 1 so that the protrusion length gradually decreases from the intermediate portion in the lateral direction toward both sides in the lateral direction. The finger resting projection portion 16 further includes a first finger resting region 18 which is a slope on one side of the top portion 16a, and a second finger resting region 19 which is a slope on the other side of the top portion 16a.

As illustrated in FIGS. 2 to 4, the first finger resting region 18 is a first inclined surface against which the index finger F2 is pressed when the user grips the grip portion 15 in the gripping mode described above, and is formed as a surface steeply inclined from the upper portion side of the battery cover 12 toward the top portion 16a. The second finger resting region 19 is a second inclined surface against which the middle finger F3 to the little finger F5 are pressed when the user grips the grip portion 15 in the gripping mode described above, and is formed as a surface gently inclined from the top portion 16a toward the lower side of the battery cover 12.

Specifically, the first finger resting region 18 is formed as an inclined surface with which the cushion of the index finger F2 of the gripping hand of the user is pressed toward the lower portion side of the battery cover 12 in the vertical direction (longitudinal direction), that is, toward the gripping hand of the user, in the gripping mode in which the thumb F1 of the user is provided over the key operation portion 5 for operating the key operation portion 5 with the thumb F1 while the other fingers F2 to F5 extending from the side of the device case 1 support the back surface of the device case 1 as illustrated in FIGS. 2 to 4.

As illustrated in FIGS. 2 to 4, the first finger resting region 18 is also an inclined surface of the scalloped portion 17 located on the side of the grip portion 15 side, and is formed to be the inclined surface rising toward the top portion 16a from the upper side on the upper side of the battery cover 12 at a steep angle. In addition, the first finger resting region 18 is curved in an arc shape corresponding to the bent state of the index finger F2 along the top portion 16a that is continuous in the lateral direction orthogonal to the vertical direction (longitudinal direction) of the device case 1.

Thus, as illustrated in FIGS. 2 to 4, this finger resting projection portion 16 is configured in such a manner that when the user grips the grip portion 15 in the gripping mode in which the thumb F1 of the user is provided over the key operation portion 5 while the other fingers F2 to F5 extending from the side of the device case 1 support the back surface of the device case 1, the index finger F2 of the user has a shape bent along the curve of the first finger resting region 18 and has the cushion pressed against the first finger resting region 18, and in this state, the first finger resting region 18 is guided toward the lower portion side of the device case 1 in the vertical direction, that is, toward the side of the gripping hand of the user.

On the other hand, the second finger resting region 19 is formed as a curved surface with which the cushions of the fingers F3 to F5 press the battery cover 12 of the grip portion 15 toward the device case 1 and the middle finger F3 to the little finger F5 are naturally bent while being arranged side by side, when the user grips the grip portion 15 in the gripping mode in which the thumb F1 of the user is provided over the key operation portion 5 for operating the key operation portion 5 with the thumb F1 while the other fingers F2 to F5 extending from the side of the device case 1 support the back surface of the device case 1 as illustrated in FIGS. 2 to 4.

Thus, as illustrated in FIGS. 2 to 4, the second finger resting region 19 is formed to have a curved surface that is gently inclined from the top portion 16a toward the lower side of the battery cover 12. Thus, the second finger resting region 19 is formed to have a gently curved shape to protrude toward the back surface side of the battery cover 12, so that the fingers F3 to F5 other than the index finger F2 are naturally bend while being arranged side by side, when the user grips the grip portion 15 in the gripping mode in which the thumb F1 of the user is provided over the key operation portion 5 while the other fingers F2 to F5 extending from the side of the device case 1 support the back surface of the device case 1.

Furthermore, as illustrated in FIGS. 1 to 5, the device case 1 has the grip portion 15 formed to be symmetric with respect to the center position of the device case 1 in the lateral direction. Thus, the device case 1 is configured such that the user can grip the grip portion 15 in the same manner using the right hand or the left hand.

Furthermore, a lower surface trigger key 20 is provided in a portion near the upper portion of the battery cover 12 in the lower case 3 of the device case 1, that is, the scalloped portion 17 in a portion near the upper portion of the battery cover 12 as illustrated in FIGS. 2 to 5. The lower surface trigger key 20 is a switch unit for causing the optical reading unit 6 to perform the reading operation, as in the case of the upper surface trigger key 5a of the key operation portion 5 and the side surface trigger keys 11.

As illustrated in FIGS. 2 to 4, the lower surface trigger key 20 is provided at a distance from the first finger resting region 18 in the finger resting projection portion 16 of the grip portion 15 on which the index finger F2 of the gripping hand of the user is rested, when the user grips the grip portion 15 with one of the hands in the gripping mode described above.

As illustrated in FIG. 4, the lower surface trigger key 20 includes a button portion 20a, an elastic sheet 20b, and a switch substrate 20c, and are attached with these components pressed against the inner surface of the lower case 3. The button portion 20a is inserted into a button hole 3a provided in the lower case 3, from the inner side to the outer side of the lower case 3.

As illustrated in FIGS. 3 and 4, the button portion 20a has a portion protruding outward from the button hole 3a of the lower case 3 with the inclined structure in which one end portion on the side of the finger resting projection portion 16 of the grip portion 15 gradually lowers toward the other end that is on the side opposite to the finger resting projection portion 16. This structure is formed with an inclination substantially the same as the inclination of the first finger resting region 18 of the finger resting projection portion 16.

Figure 16:
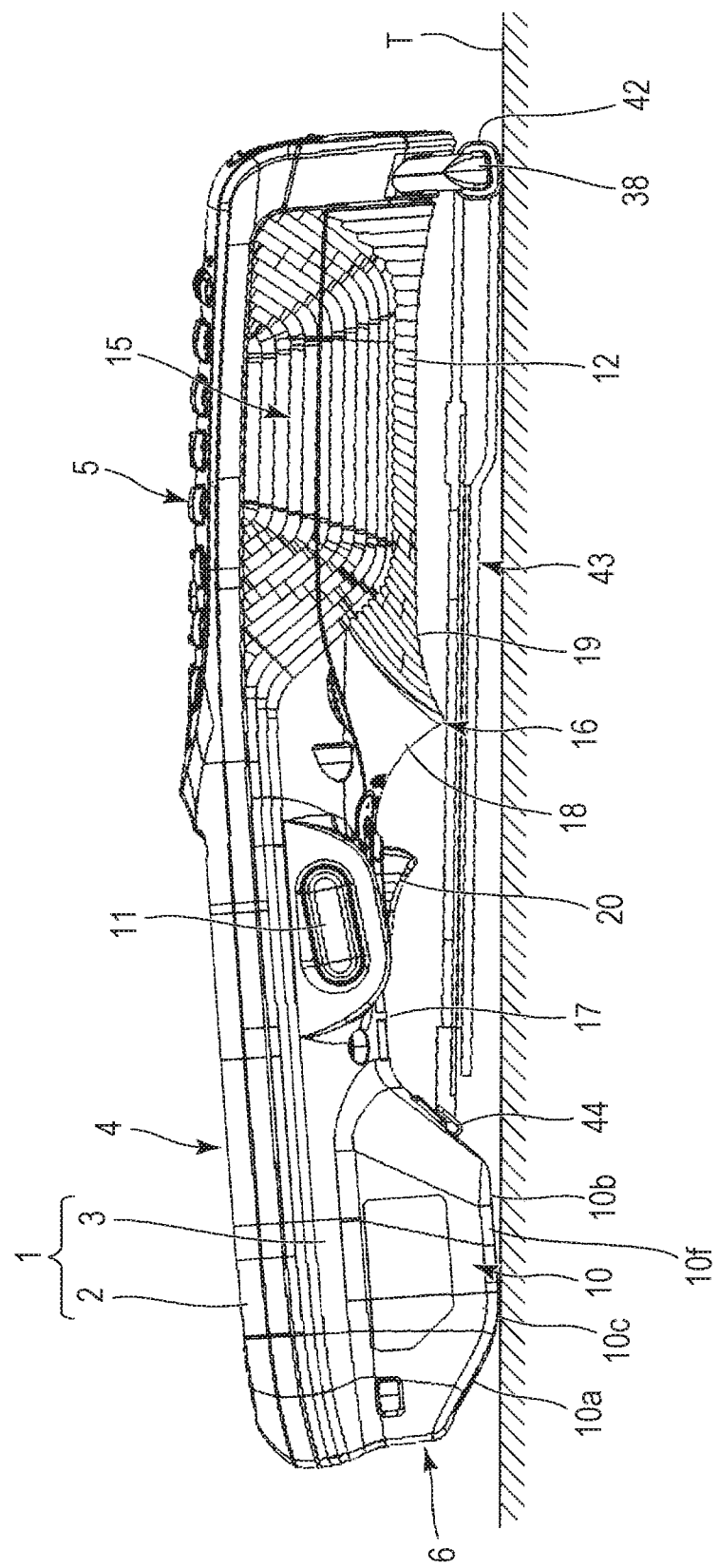
FIG. 16 is a side view illustrating a state where the portable terminal illustrated in FIG. 3 is placed on a placement surface such as a tabletop.

In this case, as illustrated in FIGS. 3 and 4, the button portion 20a is formed to have low protrusion height, from the button hole 3a of the lower case 3 to the outside of the lower case 3, which is lower than the height of the top portion 16a of the finger resting projection portion 16 of the grip portion 15, to be about the half of the height of the first finger resting region 18 of the finger resting projection portion 16 for example. For this reason, as illustrated in FIGS. 16 to 18, the button portion 20a is configured to be arranged to be above and separated from the placement surface T to be not in contact with the placement surface T, when the device case 1 is placed on the placement surface T.

Thus, as illustrated in FIGS. 3 and 4, the lower surface trigger key 20 is configured in such a manner that when the button portion 20a is pressed by the user's index finger F2 of the hand gripping the grip portion 15, the button portion 20a makes a bulging portion of the elastic sheet 20b elastically deformed to make a movable contact point of the elastic sheet 20b come into contact with a fixed contact point of the switch substrate 20c, so that a switch signal is output.

The left and right side surface trigger keys 11 provided on both side portions of the device case 1 have the same structure. Therefore, in the following description, the side surface trigger key 11 provided on the left side surface of the device case 1 will be described. As illustrated in FIGS. 2 and 3, the left side surface trigger key 11 is provided with a button portion 22 exposed on the left side surface of the wide portion 1a of the device case 1 located in the vicinity of the grip portion 15.

Specifically, as illustrated in FIGS. 1 to 3, the side surface trigger key 11 is arranged on the left side of the lower portion side of the display portion 4 provided on the front surface that is the upper surface in the wide portion 1a of the device case 1. In this case, the button portion 22 of the side surface trigger key 11 is formed to have a substantially rectangular shape elongated along the longitudinal direction of the device case 1. The button portion 22 is arranged in an inclined state, with the front surface of the device case 1 serving as a reference surface, so that the distance with respect to the reference surface of the device case 1 in a thickness direction increases as it gets farther from the side of the grip portion 15.

In other words, as illustrated in FIG. 3, the button portion 22 is provided to be in an inclined state so that a distance with respect to the reference surface of the device case 1 at one end portion on the side of the grip portion 15 becomes shorter than a distance with respect to the reference surface of the device case 1 at the other end portion on the side of the optical reading unit 6 positioned on the side opposite to the grip portion 15. Thus, the button portion 22 is provided such that the center line along its longitudinal direction is inclined at a predetermined inclination angle with respect to the front surface which is the reference surface of the device case 1.

Thus, as illustrated in FIG. 3, the left side surface trigger key 11 is configured so that the index finger F2 is provided on the left side button portion 22, when the index finger F2 of the user pressed against the first finger resting region 18 is separated from the first finger resting region 18 to be extended, in the state where the user grips the grip portion 15 in a first gripping way, in a gripping mode in which the thumb F1 of the user is provided over the key operation portion 5 and the other fingers F2 to F5 extending from the side of the device case 1 support the back surface of the device case 1.

Furthermore, as illustrated in FIG. 3, the left side surface trigger key 11 is arranged so that the index finger F2 of the user arranged on the right side surface of the device case 1 is arranged on the left button portion 22 while being inclined, when the user grips the grip portion 15 in a second gripping way in which the thumb F1 of the user is provided on the right side surface of the grip portion 15 and the other fingers F2 to F5 are wound around the back surface of the grip portion 15 from the right side of the grip portion 15 with the user's right palm covering the key operation portion 5 provided on the front surface that is the upper surface of the grip portion 15.

Thus, as illustrated in FIG. 3, the button portion 22 of the left side surface trigger key 11 is arranged so that the index finger F2 of the user arranged on the right side surface of the device case 1 is naturally arranged on the left button portion 22, when the user grips the grip portion 15 in the second gripping way in which the thumb F1 of the user is provided on the left side surface of the grip portion 15 and the other fingers F2 to F5 are wound around the back surface of the grip portion 15 from the right side of the grip portion 15 with the user's right palm covering the key operation portion 5 provided on the front surface that is the upper surface of the grip portion 15.

As illustrated in FIG. 2, the right side surface trigger key 11 is configured so that the thumb F1 is provided on the right side button portion 22 as a result of moving the thumb F1 to the side surface of the device case 1, in the state where the user grips the grip portion 15 in the first gripping way, in the gripping mode in which the thumb F1 of the user is provided over the key operation portion 5 and the other fingers F2 to F5 extending from the side of the device case 1 support the back surface of the device case 1.

Furthermore, as illustrated in FIG. 2, the right side surface trigger key 11 is arranged so that the thumb F1 of the user arranged on the left side surface of the device case 1 is naturally arranged on the right button portion 22, when the user grips the grip portion 15 in the second gripping way in which the thumb F1 of the user is provided on the right side surface of the grip portion 15 and the other fingers F2 to F5 are wound around the back surface of the grip portion 15 from the right side of the grip portion 15 with the user's right palm covering the key operation portion 5 provided on the front surface that is the upper surface of the grip portion 15.

The side surface trigger keys 11 provided on the left and right sides of the device case 1 include the button portion 22, an elastic member 23, a contact member 24, and a pair of guide portions 25, as illustrated in FIGS. 6 to 9. The button portion 22 includes a rectangular cap-shaped button body 22a that is elongated in the front and back direction of the device case 1, and a plurality of pressing portions 22b arranged in the button body 22a that is retractably inserted in an elongated button insertion hole 26 provided in a state of being inclined at a predetermined inclination angle on the side surface of the lower case 3.

Figure 6:
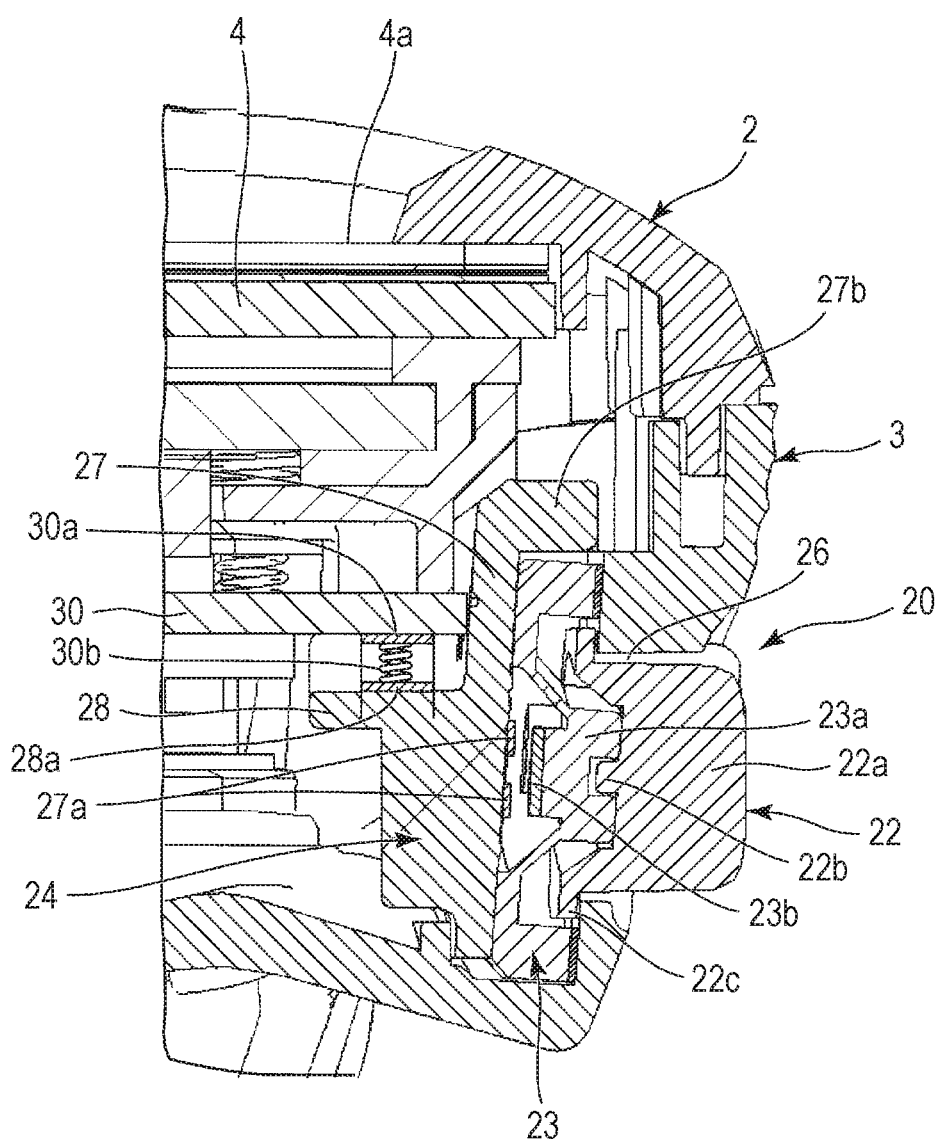
FIG. 6 is an enlarged cross-sectional view of a main part of the portable terminal illustrated in FIG. 1 taken along a line indicated by arrows B-B.

In this structure, as illustrated in FIG. 6, the button body 22a has an outer circumference portion, on the inner side of the lower case 3, provided with a flange portion 22c in an annular shape. Thus, when the button body 22a is inserted into the button insertion hole 26 of the lower case 3 from the inside of the lower case 3, the flange portion 22a comes into contact with the inner circumference edge of the button insertion hole 26 of the lower case 3 so that the button body 22a inclined at a predetermined angle on the side surface of the lower case 3 is prevented from being pulled out from the lower case 3.

As illustrated in FIG. 6, the elastic member 23 is an elastic sheet made of urethane rubber, silicone rubber, or the like, is formed to have a rectangular shape slightly larger than the outer shape of the button portion 22, and is provided on the inner surface of the lower case 3 while being attached to the button portion 22. Specifically, the elastic member 23 protrudes toward the plurality of pressing portions 22b of the button portion 22 with the bulging portion 23a having a dome shape at a center portion of the elastic sheet being inclined at a predetermined inclination angle on the side surface of the lower case 3. The bulging portion 23a incorporates a plurality of movable contacts 23b corresponding to the plurality of pressing portions 22b.

Furthermore, as illustrated in FIG. 6, the outer circumference portion of the elastic member 23 is attached to the outer circumference of the button body 22a by adhesion. Thus, the elastic member 23 is configured to be provided on the inner surface of the lower case 3 together with the button portion 22, while being attached to the button portion 22 by adhesion with the plurality of pressing portions 22b of the button portion 22 pressed into the bulging portion 23a.

Figure 7:
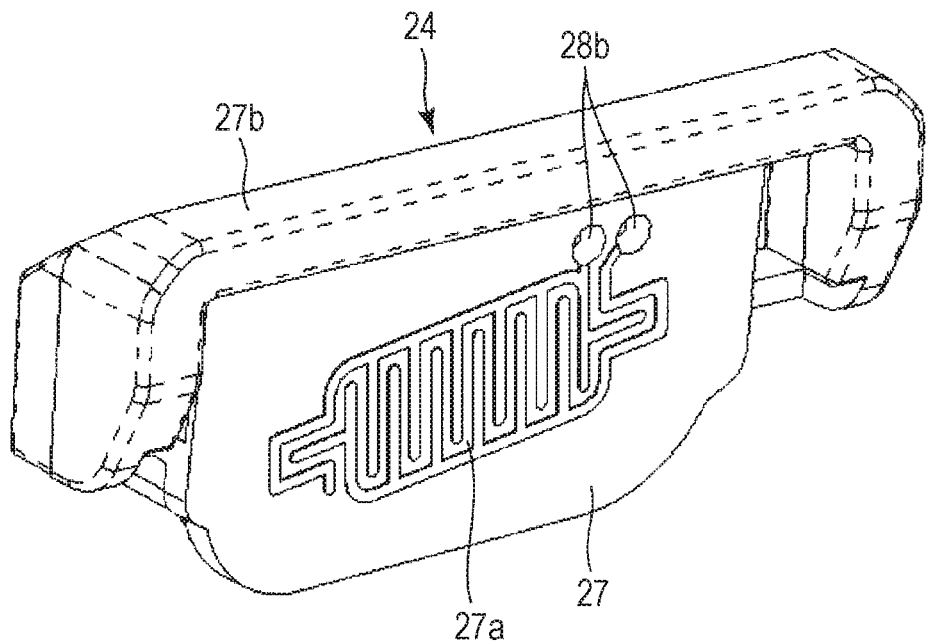
FIG. 7 is an enlarged perspective view of a contact member of a side surface trigger key illustrated in FIG. 6 as viewed from a side of a contact electrode.
Figure 8:
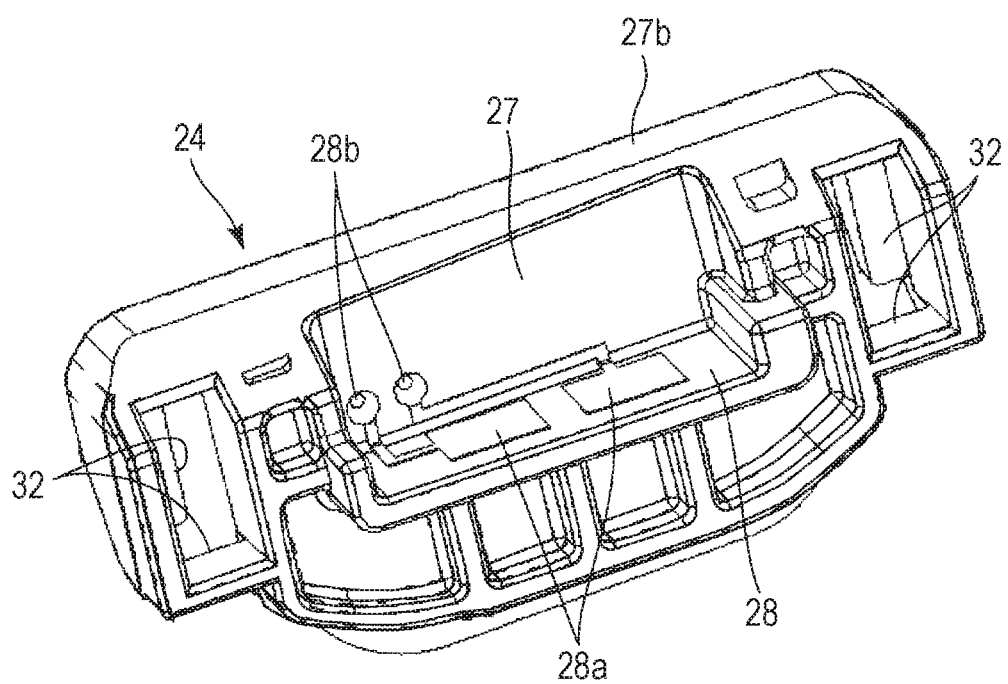
FIG. 8 is an enlarged perspective view of the contact member of the side surface trigger key illustrated in FIG. 6 as viewed from a side of a terminal electrode.

As illustrated in FIGS. 6 to 8, the contact member 24 is configured to overlap the inner surface of the elastic member 23 and press and fix the elastic member 23 on the inner surface of the lower case 3. Specifically, the contact member 24 includes a contact body portion 27 corresponding to the inner surface of the elastic member 23 and a terminal arrangement portion 28 provided on the surface of the contact body portion 27 opposite to the elastic member 23.

As illustrated in FIGS. 6 and 7, the contact body portion 27 is formed to have a plate shape with substantially the same size as the elastic member 23. On the outer surface of the contact body portion 27 facing the elastic member 23, a pair of comb-shaped contact electrodes 27a, corresponding to the plurality of movable contacts 23b of the elastic member 23, are provided while being inclined at a predetermined inclination angle on the side surface of the lower case 3.

As illustrated in FIG. 6 and FIG. 7, the pair of comb-shaped contact electrodes 27a becomes conductive upon separably coming into contact with any or all of the plurality of movable contacts 23b of the elastic member 23. In this this, a cover portion 27b that covers the upper portion and both side portions of the elastic member 23 is provided on the upper portion and both side portions of the contact body portion 27.

As illustrated in FIGS. 6 to 8, the terminal arrangement portion 28 also serves as a reinforcing rib that reinforces the contact body portion 27, and is provided on the inner surface of the contact body portion 27 opposite to the elastic member 23, while protruding toward the inner side of the device case 1. A pair of terminal electrodes 28a are provided on the upper surface of the terminal arrangement portion 28. The pair of terminal electrodes 28a is electrically connected to the pair of contact electrodes 27a provided on the contact body portion 27 via through holes 28b.

Furthermore, as illustrated in FIG. 6, an end portion of a circuit board 30 provided in the device case 1 is arranged on the terminal arrangement portion 28. Thus, the pair of terminal electrodes 28a are respectively electrically connected to the pair of connection terminals 30a provided on the lower surface at the end of the circuit board 30 by means of spring members 30b. Thus, the contact member 24 has the pair of contact electrodes 27a of the contact body portion 27 electrically connected to the circuit board 30 via the pair of terminal electrodes 28a of the terminal arrangement portion 28.

Figure 9:
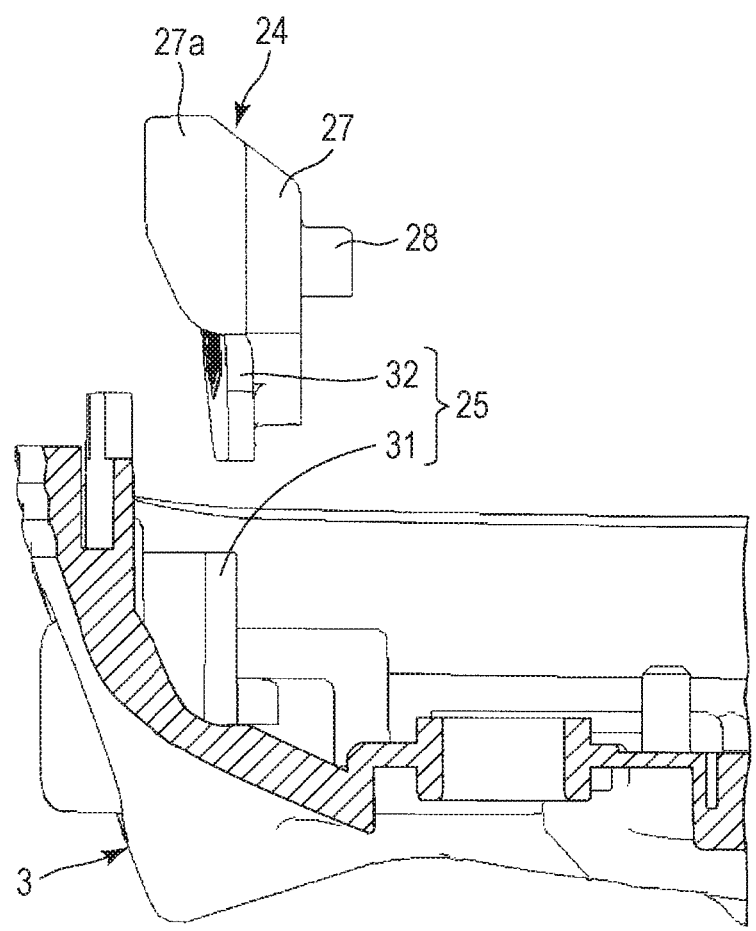
FIG. 9 is an exploded perspective view of a main part illustrating a state in which the side surface trigger key illustrated in FIG. 6 is assembled.

As illustrated in FIGS. 8 and 9, the pair of guide portions 25 include a pair of guide rails 31 that stand in the lower case 3 while being positioned on both ends of the elastic member 23 and a pair of slide portions 32 respectively provided on both ends of the contact member 24. As illustrated in the principle diagrams of FIGS. 10A to 10D, the pair of guide portions 25 are configured such that the pair of guide rails 31 guides the pair of slide portions 32 so that the contact body portion 27 of the contact member 24 gradually moves to, overlap, and then is pressed against the elastic member 23.

As illustrated in FIG. 9, each of the pair of guide rails 31 stands vertically (90° angle) on the bottom of the lower case 3, but in the principle diagrams of FIGS. 10A to 10D, for convenience, the guide rail 31 is provided in an inclined state. Furthermore, as illustrated in FIG. 8, the pair of slide portions 32 is provided on both sides of the contact member 24, and is configured to slide vertically along the guide rail 31 while sandwiching guide rail 31.

In this case, when the elastic member 23 is attached to the button portion 22 and disposed in the lower case 3, the elastic member 23 is provided in the lower case 3 in a state of being inclined at an inclination angle, specifically, at a draft angle of approximately 4° relative to a mold draft direction, so that the distance between the guide rail 31 and the facing surface of the elastic member 23 facing the contact body portion 27 gradually decreases from the upper side toward the lower side. Still, in the principle diagrams of FIGS. 10A to 10D, the elastic member 23 is illustrated in a vertical state for convenience of explanation.

Furthermore, the contact body portion 27 is inclined with respect to the pair of guide rails 31 so that the electrode surface on which the pair of contact electrodes 27a is provided becomes parallel to the facing surface of the elastic member 23 at the same inclination angle. Still, in the principle diagrams of FIGS. 10A to 10D, the contact body portion 27 is also illustrated in a vertical state for convenience of explanation.

With this configuration, as illustrated in FIGS. 7 to 9, at a guide starting timing when guiding the pair of slide portions 32 provided to the contact member 24, the pair of guide rails 31 are configured to be arranged with a clearance a provided between a facing surface of the elastic member 23 and an electrode surface of the contact body portion 27, in a state that the electrode surface of the contact body portion 27 faces the facing surface of the elastic member 23 while being shifted in a surface direction as illustrated in the principle diagrams of FIGS. 10A to 10D.

Figure 10A:
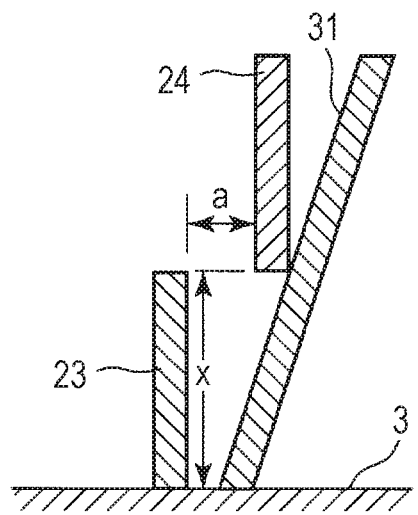
FIG. 10A is a diagram showing in principle a state in which a contact member is gradually moved toward an elastic member to overlap the elastic member in the side surface trigger key illustrated in FIG. 9, and illustrates a slide start timing of the contact member.
Figure 10B:
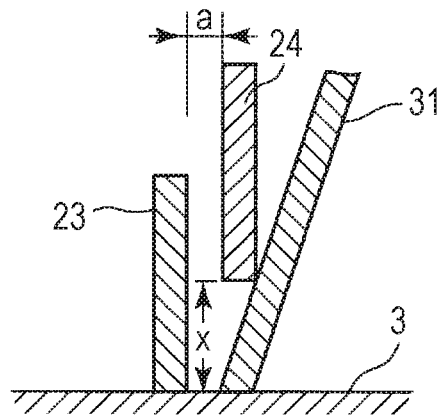
FIG. 10B is a diagram showing in principle a state in which the contact member is gradually moved toward the elastic member to overlap the elastic member in the side surface trigger key illustrated in FIG. 9, and illustrates a slide intermediate period of the contact member.
Figure 10C:
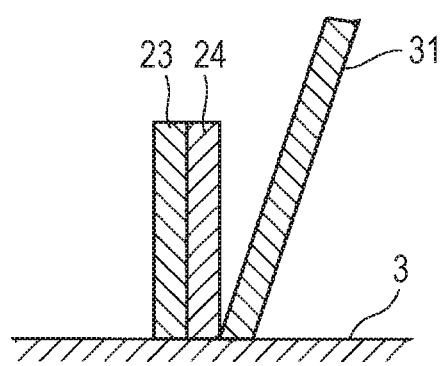
FIG. 10C is a diagram showing in principle a state in which the contact member is gradually moved toward the elastic member to overlap the elastic member in the side surface trigger key illustrated in FIG. 9, and illustrates a slide end timing of the contact member.
Figure 10D:
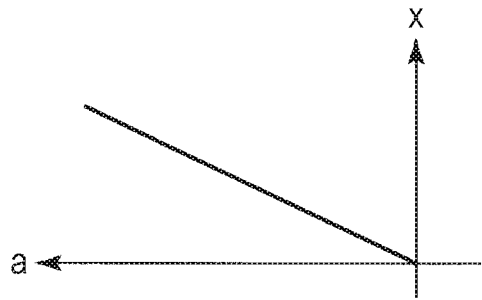
FIG. 10D is a diagram showing in principle a state in which the contact member is gradually moved toward the elastic member to overlap the elastic member in the side surface trigger key illustrated in FIG. 9, and illustrates relationship between a slide length x of the elastic member and a movement length a of the contact member relative to the elastic member.

Furthermore, as illustrated in FIGS. 7 to 9, the pair of guide rails 31 are configured in such a manner that, in an intermediate period during which the sliding of the pair of slide portions 32 is guided, the contact body portion 27 gradually moves toward the elastic member 23 so that the clearance a between the facing surface of the elastic member 23 and the electrode surface of the contact body portion 27 gradually decreases as illustrated in FIGS. 10B and 10D.

Furthermore, as illustrated in FIGS. 6 to 9, the pair of guide rails 31 is configured in such a manner that at a slide end timing at which the contact member 24 reaches the bottom portion of the lower case 3 with the pair of slide portions 32 guided, the facing surface of the elastic member 23 and the electrode surface of the contact body portion 27 are in pressure contact with each other while facing and overlapping with each other as illustrated in the principle diagrams of FIGS. 10C and 10D.

In this manner, as illustrated in FIGS. 6 to 10D, the contact member 24 is configured in such a manner that, when the pair of slide portions 32 are guided by the pair of guide rails 31 of the pair of guide portions 25 to make the contact body portion 27 of the contact member 24 overlap the elastic member 23, the electrode surface of the contact body portion 27 gradually moves toward the facing surface of the elastic member 23 facing the electrode surface with the clearance a provided between the facing surface of the elastic member 23 and the electrode surface of the contact body portion 27 due to the sliding of the pair of slide portions 32 guided by the pair of guide rails 31, and the electrode surface of the contact body portion 27 comes into pressure contact with the facing surface of the elastic member 23 while facing and overlapping with each other at the slide end timing as illustrated in FIG. 6 to FIG. 10D.

In this case, as illustrated in FIGS. 6 and 9, the contact member 24 is configured in such a manner that when the contact body portion 27 is pressed against the elastic member 23 and pressed against the elastic member 23, a cover portion 27b of the contact body portion 27 is fixed while being pressed against the inner surface of the lower case 3 due to elastic force of the elastic member 23 in a state that the pair of contact electrodes 27a of the contact body portion 27 correspond to the plurality of movable contacts 23b.

With this configuration, as illustrated in FIG. 6, the side surface trigger key 11 is configured in such a manner that when the button portion 22 is pressed, the plurality of pressing portions 22b of the button portion 22 press the bulging portion 23a of the elastic member 23 so that the bulging portion 23a elastically deforms. As a result, some or all of the plurality of movable contacts 23b in the bulging portion 23a elastically deformed come into contact with the pair of comb-shaped contact electrodes 27a provided to the contact body portion 27 of the contact member 24. Thus, the pair of contact electrodes 27a are conducted so that a switch signal is output to the circuit board 30.

Figure 11:
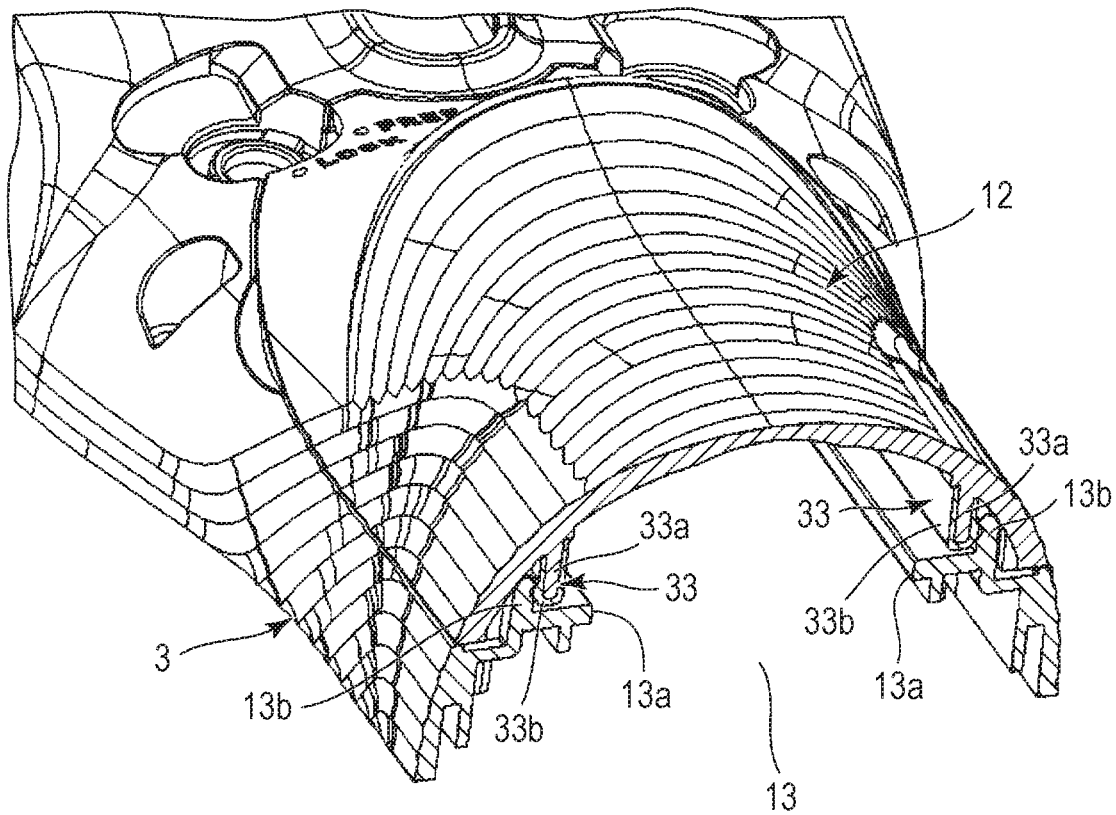
FIG. 11 is an enlarged perspective view of a main part and is a breakaway view of a grip portion of the portable terminal illustrated in FIG. 2 taken along a line indicated by arrows C-C.

As illustrated in FIG. 3, the device case 1 has a structure in which an inclined portion 15a is provided in the lower case 3. The inclined portion 15a is inclined so that a lower side end portion of the grip portion 15 protrudes toward a back surface side (the left side in FIG. 3). As illustrated in FIGS. 10A to 11, the opening portion 13a of the battery container portion 13 provided in the lower case 3 is provided over a region from the inclined portion 15a on the lower side of the lower case 3 to the vicinity of the pair of attachment levers 14 on the upper side of the lower case 3.

Figure 5:
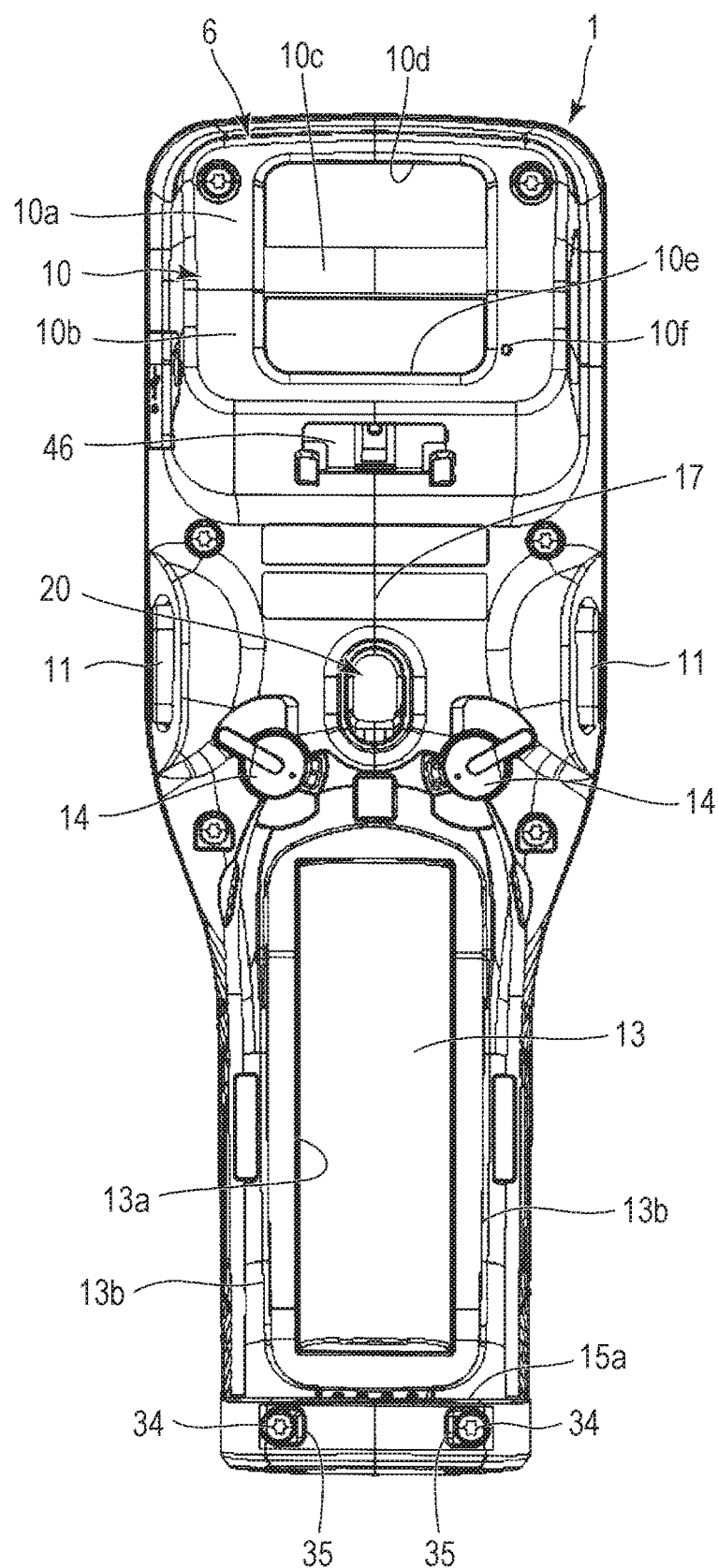
FIG. 5 is a back view of the portable terminal illustrated in FIG. 2, showing a state where a battery cover is removed.

As illustrated in FIGS. 5, 11, and 12, an outer frame 13b, which is a pressure contact frame, is provided to be in a frame shape over the entire circumference of the opening portion 13a. Specifically, the outer frame 13b is provided over a region from the inclined portion 15a of the lower case 3 to the vicinity of the pair of attachment levers 14 in the lower case 3, and is configured to surround the outer circumference of the opening portion 13a.

Furthermore, as illustrated in FIGS. 5, 11, and 12, the outer frame 13b has an upper portion, away from the locking portion 3b, with a shape gently protruding and curving in a direction away from the locking portion 3b of the lower case 3 into which the fulcrum protrusion portion 12a of the battery cover 12 is inserted. Thus, the entire outer frame 13b is formed in a shape close to a pentagon.

Figure 13A:
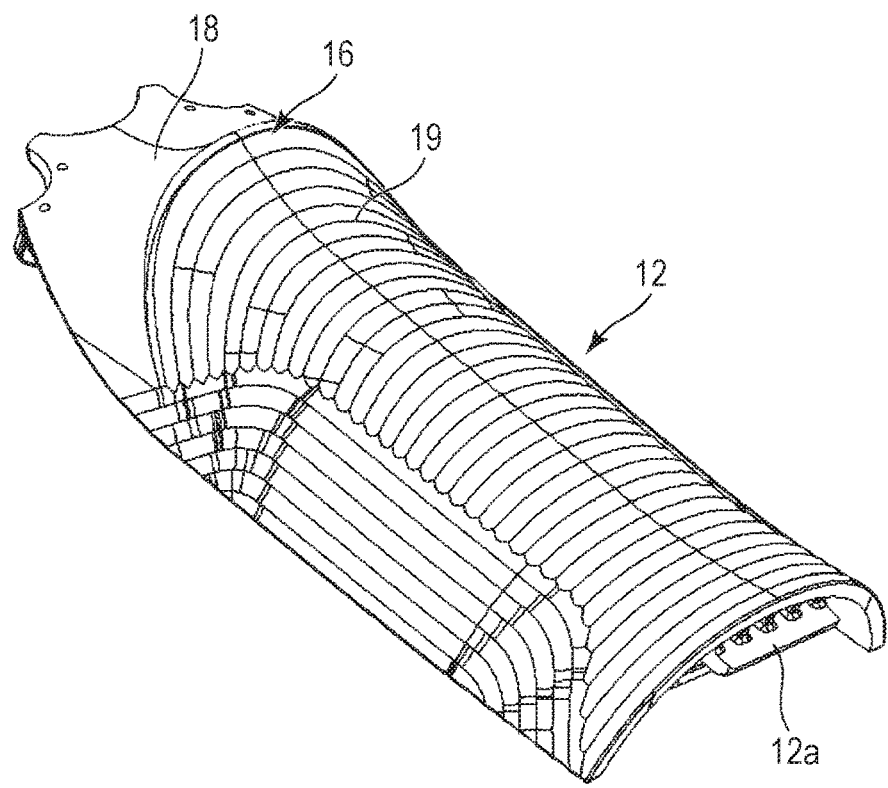
FIG. 13A is an enlarged perspective view of the battery cover of a grip portion illustrated in FIG. 2 as viewed from the outer side.
Figure 13B:
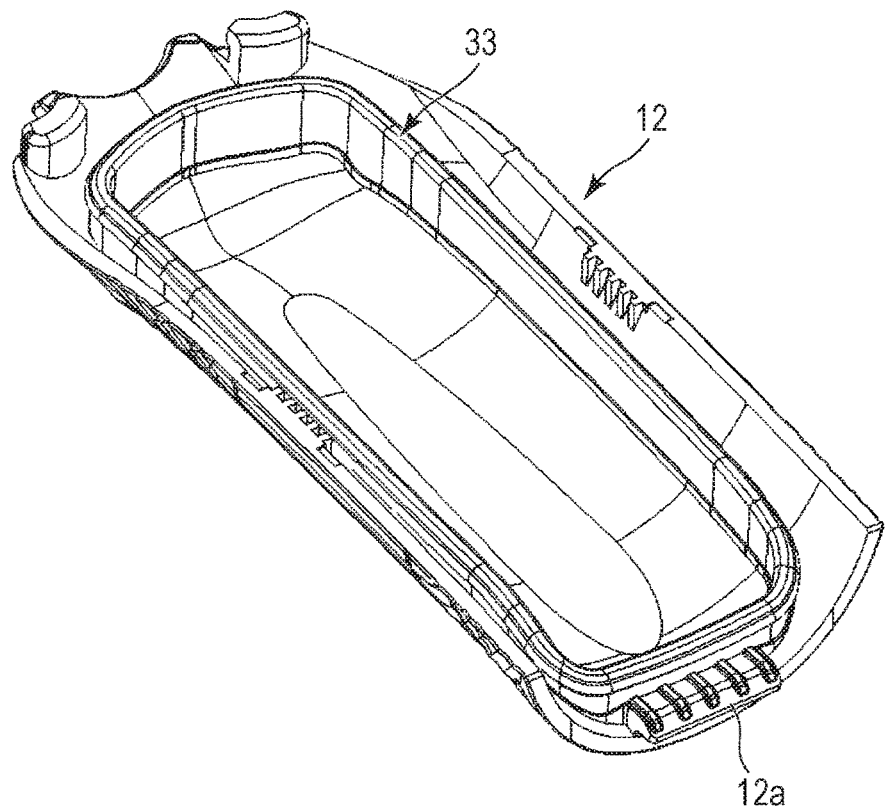
FIG. 13B is an enlarged perspective view of the battery cover of the grip portion illustrated in FIG. 2 as viewed from an inner surface side.
Figure 14:
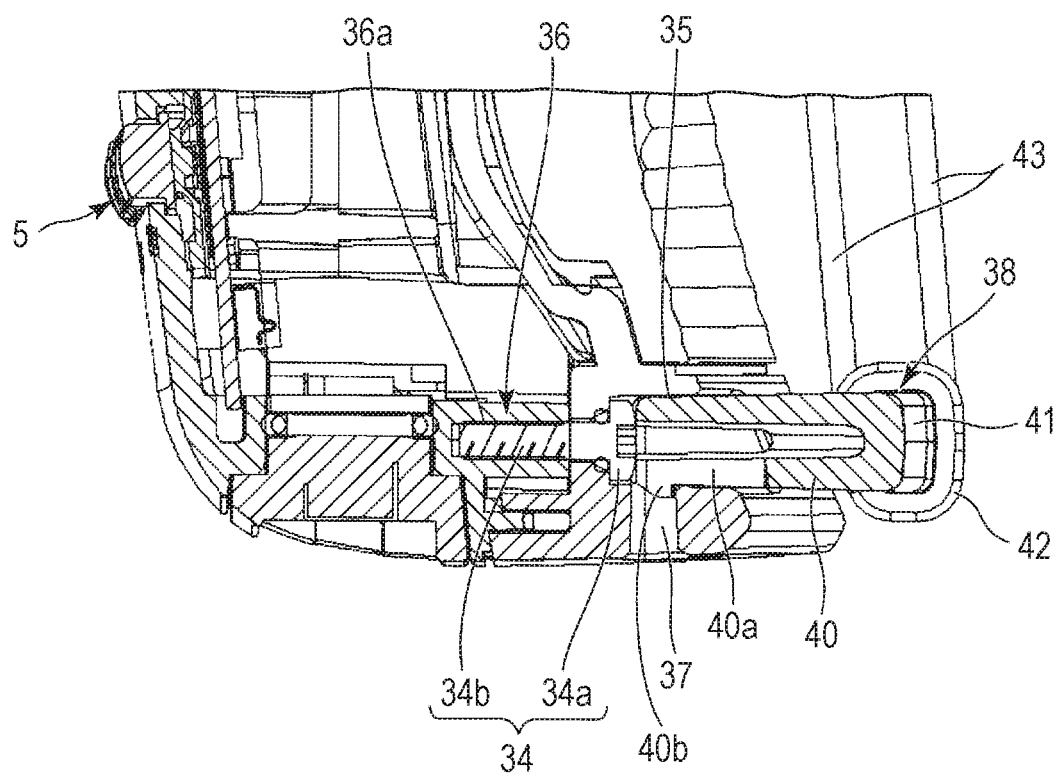
FIG. 14 is an enlarged cross-sectional view of a main part of the portable terminal illustrated in FIG. 2 taken along a line indicated by arrows E-E.

As illustrated in FIGS. 12 to 14, the battery cover 12 that closes the opening portion 13a of the battery container portion 13 has an outer shape that is larger than the opening portion 13a of the battery container portion 13 and is of the same size as the outer surface of the lower case 3, and has the outer circumference edge formed to match the outer surface of the lower case 3. On the inner surface of the battery cover 12, a packing portion 33 is provided along the inner circumference of the outer frame 13b provided around the opening portion 13a of the battery container portion 13.

As illustrated in FIGS. 11 to 14, the packing portion 33 includes an inner frame 33a that is a support frame provided on the battery cover 12, and a packing rubber member 33b that is provided integrally with the inner frame 33a and covers the inner frame 33a, and has a structure in which these components are provided so as to be inclined to be more on the inner side of the battery cover 12 at a portion closer to the fulcrum protrusion portion 12a of the battery cover 12. In this case, the inner frame 33a serving as a support frame is provided to be in a frame shape on the inner surface of the battery cover 12 along the inner circumference of the outer frame 13b of the lower case 3. Furthermore, the packing portion 33 is provided so as to incline to be more on the side opposite to the lower case 3 at a portion closer to the fulcrum protrusion portion 12a. Furthermore, the packing portion 33 is provided so as to incline to be more on the side opposite to the depth direction of the opening portion 13a at a portion closer to the fulcrum protrusion portion 12a.

Thus, as illustrated in FIGS. 12 to 14, the inner frame 33a is provided, on the inner surface of the battery cover 12, over a region from the inclined portion 15a of the lower case 3 to the vicinity of the pair of attachment levers 14 on the upper side of the lower case 3, similarly to the outer frame 13b. Similarly to the outer frame 13b, the inner frame 33a is formed in a shape with an upper portion, separated from the fulcrum protrusion portion 12a of the battery cover 12, gently protruding and curving in a direction away from the fulcrum protrusion portion 12a Thus, the entire inner frame 33a is formed in a shape close to a pentagon, similarly to the outer frame 13b.

As illustrated in FIGS. 12 to 14, the packing rubber member 33b is made of an elastic material such as silicone rubber or urethane rubber, and is preferably made of silicone rubber. The packing rubber member 33b is integrally formed with the entire circumference of the inner frame 33a of the battery cover 12 while covering the inner frame 33a, by insert molding. Furthermore, the packing rubber member 33b is formed to have an outer side at the distal end of the inner frame 33a protruding in an arc shape.

With this configuration, as illustrated in FIGS. 11 to 14, the packing portion 33 is configured in such a manner that when the fulcrum protrusion portion 12a of the battery cover 12 is locked to the locking portion 3b provided on the lower portion of the battery container portion 13 and the opening portion 13a of the battery container portion 13 is closed as a result of rotating the battery cover 12 about the fulcrum protrusion portion 12a thus locked, the packing portion 33 protruding in the arc shape at the distal end portion of the inner frame 33a is in pressure contact with the inner surface of the outer frame 13b in a state that the outer surface of the inner frame 33a is facing the inner surface of the outer frame 13b of the opening portion 13a, and thus, the opening portion 13a is waterproofed.

In this configuration, as illustrated in FIGS. 11 to 14, the packing portion 33 is inclined to be more on the inner side of the battery cover 12 at a portion closer to the fulcrum protrusion portion 12a of the battery cover 12. Thus, when the battery cover 12 rotates about the fulcrum protrusion portion 12a to close the opening portion 13a of the battery container portion 13, close contact resistance increases as a close contact portion of the packing rubber member 33b with respect to the inner surface of the outer frame 13b provided on the circumference of the opening portion 13a of the battery container portion 13 increases, so that an operation load of the battery cover 12 gradually increases. Thus, an opening/closing operation of the battery cover 12 is improved.

Furthermore, as illustrated in FIGS. 2 and 14, a plurality of screw holes 35 with which the upper case 2 and the lower case 3 are attached to each other by a plurality of screws 34 are provided in an end portion of the inclined portion 15a on the lower side of the grip portion 15 of the device case 1. Specifically, the plurality of screw holes 35 are holes into which heads 34a of the screws 34 are inserted, and are arranged along a shorter side direction (width direction) orthogonal to the longitudinal direction of the grip portion 15 at the end of the inclined portion 15a in the lower case 3.

As illustrated in FIG. 14, the plurality of screws 34 each have the head portion 34a and a screw portion 34b, and is configured in such a manner that the screw portion 34b is screwed in a screw hole 36a of a boss portion 36 provided in the upper case 2 in a state where the head portion 34a is inserted in the screw hole 35. Thus, the plurality of screws 34 are configured in such a manner that, when the screw portion 34b is screwed into the screw hole 36a of the boss portion 36 of the upper case 2 and fastened into the screw 36a, the head portion 34a causes the lower case 3 to be pressed against the boss portion 36 of the upper case 2, so that the upper case 2 and the lower case 3 are attached to each other.

In this case, as illustrated in FIG. 14, each of the plurality of screw holes 35 also serves as a strap hole 37 in communication with a back surface of the lower case 3 an end surface of the lower case 3 orthogonal to the back surface of the lower case 3. Specifically, the strap hole 37 is configured such that a strap can be attached by passing a string through the strap hole 37.

Figure 15A:
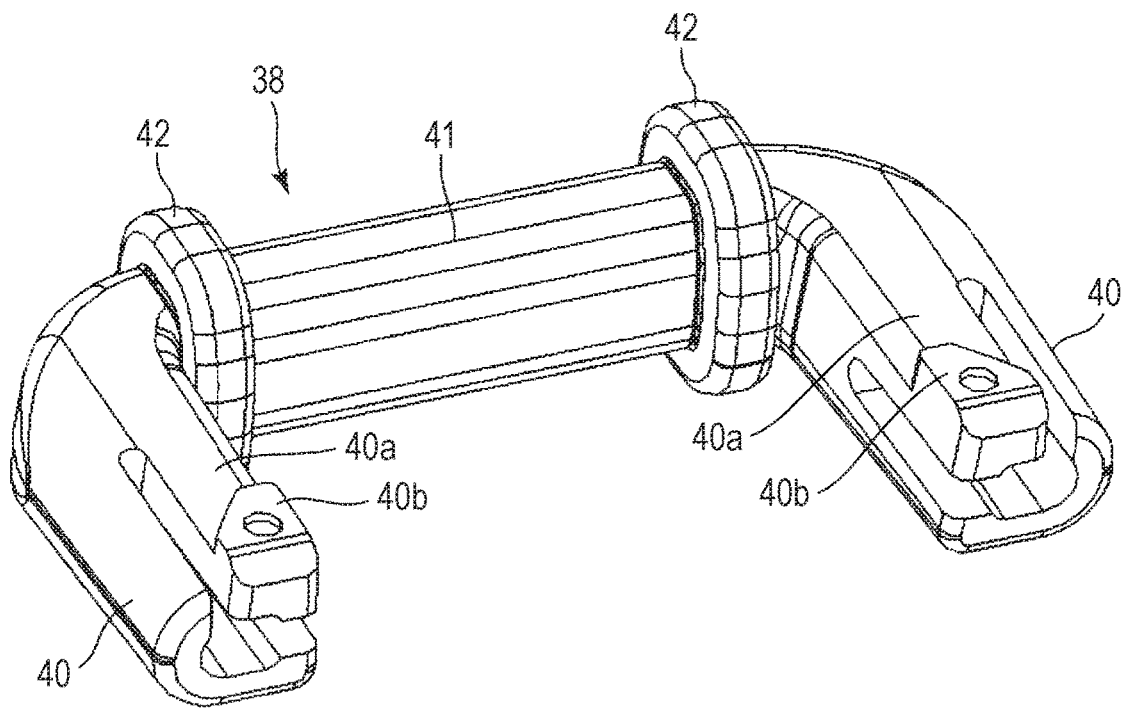
FIG. 15A is an enlarged perspective view of a leg portion illustrated in FIG. 14.

Furthermore, as illustrated in FIG. 15A to FIG. 16, a bridge-shaped leg portion 38 is detachably attached to the plurality of screw holes 35. Specifically, the leg portion 38 also serves as a belt attachment portion to which a hand belt 43 described later is attached. When the device case 1 is placed on the placement surface T such as a tabletop, as illustrated in FIG. 16, the leg portion 38 supports the lower portion side of the lower case 3 in a state where the optical container portion 10 on the upper portion side of the lower case 3 is placed on the placement surface T, so that the device case 1 is stably placed on the placement surface T.

Figure 15B:
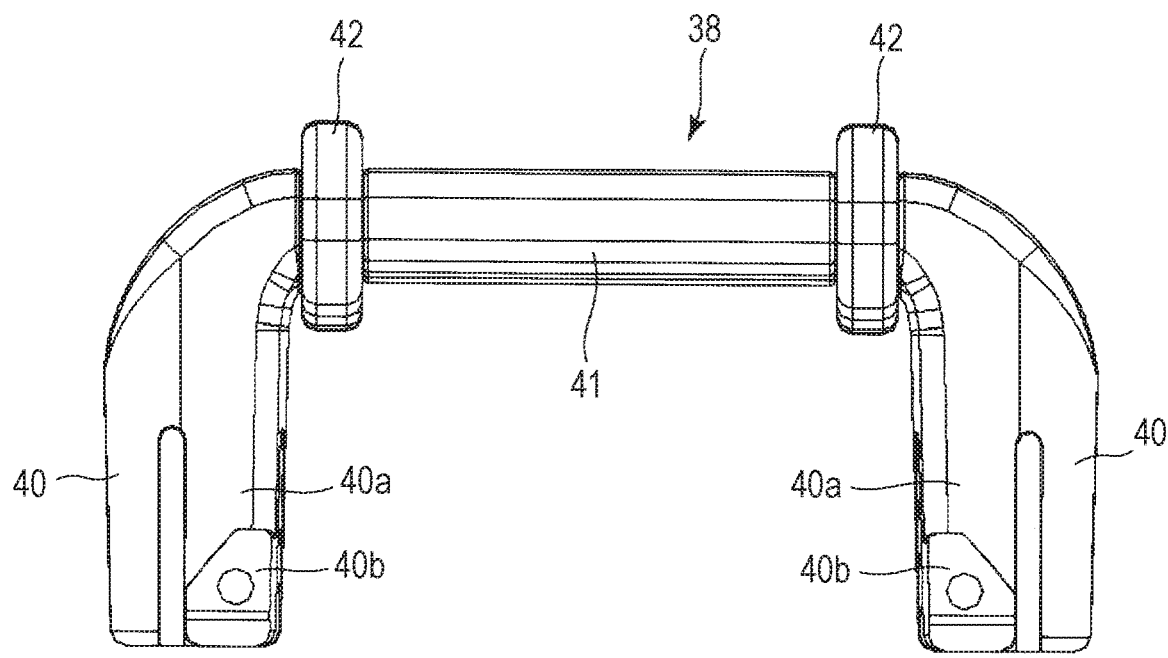
FIG. 15B is an enlarged front view of the leg portion illustrated in FIG. 14.

In this case, as illustrated in FIGS. 14 to 15B, the leg portion 38 includes a pair of support pieces 40 that are removably attached to the screw holes 35 of the lower case 3, respectively and a beam portion 41 is bridged between the pair of support pieces 40 and is provided over the top of the inclined portion 15a on both sides in the shorter side direction (width direction) orthogonal to the longitudinal direction of the grip portion 15 at the inclined portions 15a of the lower case 3.

As illustrated in FIGS. 15A to 16, the pair of support pieces 40 include hook portions 40a that detachably engage with the strap holes 37 positioned on end surface sides of the lower case 3 orthogonal to the back surface of the lower case 3, upon being inserted into the screw holes 35 from the back surface side of the lower case 3. The hook portions 40a have lower ends provided with engagement protrusions 40b.

Thus, as illustrated in FIGS. 15A to 16, when the support piece 40 is inserted into the screw hole 35 of the lower case 3, the engagement protrusion 40b is pressed by the inner surface of the screw hole 35 so that the hook portion 40a is warped. Furthermore, when the support pieces 40 are inserted into the screw holes 35 of the lower case 3, the hook portions 40a are elastically restored so that the engagement protrusions 40b can be detachably engaged with the strap holes 37 positioned on the end surface sides of the lower case 3 orthogonal to the back surface of the lower case 3.

Furthermore, the support piece 40 is configured in such a manner that, as illustrated in FIGS. 15A to 16, when the hook portion 40a is warped using a tool inserted into the strap hole 37 positioned on the end surface side of the lower case 3 orthogonal to the back surface of the lower case 3 to press the engagement protrusion 40b of the hook portion 40a, the engagement protrusion 40b is pressed into the screw hole 35, so that the support piece 40 is pushed out from the screw hole 35.

As illustrated in FIGS. 15A to 16, the beam portion 41 is bridged between the pair of support pieces 40 and is provided over the top of the inclined portion 15a on both sides in the shorter side direction (width direction) orthogonal to the longitudinal direction of the grip portion 15 in the inclined portions 15a in the lower case 3. Thus, the beam portion 41 connects the pair of support pieces 40 to each other, and is placed on the placement surface T such as a tabletop. Furthermore, a hand belt 43 described later is folded back at and attached to the beam portion 41.

As illustrated in FIGS. 15A and 15B, anti-slip portions 42 are provided on both sides of the beam portion 41 in the shorter side direction orthogonal to the longitudinal direction of the hand belt 43. The anti-slip portion 42 is formed of a rubber material such as urethane rubber or silicone rubber, and prevents slipping on the placement surface T. The anti-slip portion 42 is formed to have a ring shape, and is formed to have thickness in a radial direction that is larger than the thickness of the hand belt 43.

With this configuration, as illustrated in FIGS. 16 and 17, when the device case 1 is placed on the placement surface T such as a tabletop with the leg portion 38 attached, the boundary portion 10c and the leg portion 38 are placed on the placement surface T. The boundary portion 10c is positioned at a boundary between the first surface 10a and the second surface 10b of the optical container portion 10, that is, the boundary portion 10c is an end portion on the side of the first surface 10a with respect to the reference portion that is an area including the sound collection hole 10f of the second surface 10b.

In this state, the device case 1 is configured to be placed on the placement surface T with a gap provided between the second surface 10b of the optical container portion 10 and the placement surface T, in a state that the reference portion of the second surface 10b is not in contact with the placement surface T, and an end portion of the second surface 10b on the opposite side of the first surface 10a, that is, an end portion on the side opposite to the boundary portion 10c is separated from the placement surface T. Thus, the device case 1 has a structure in which the microphone sound collection hole 10f or the speaker sound emission hole provided in the second surface 10b, which is a planer region of the optical container portion 10, is not blocked by the placement surface T.

Furthermore, as illustrated in FIG. 18, when the device case 1 is placed on the placement surface T with the leg portion 38 removed from the lower case 3, an end portion of the second surface 10b positioned on the opposite side of the boundary portion 10c with respect to the reference portion that is an area including the sound collection hole 10f of the second surface 10b of the optical container portion 10 and an end portion of the inclined portion 15a positioned on the lower portion of the lower case 3 are placed on the placement surface T.

In this state, the device case 1 is configured to be placed on the placement surface T with a gap provided between the second surface 10b of the optical container portion 10 and the placement surface T, in a state that the reference portion of the second surface 10b is not in contact with the placement surface T, and an end portion of the second surface 10b on the side of the first surface 10a, that is, an end on the side of the boundary portion 10c is separated from the placement surface T. Thus, the device case 1 has a structure in which the microphone sound collection hole 10f or the speaker sound emission hole provided in the second surface 10b, which is a planer region of the optical container portion 10, is not blocked by the placement surface T.

Furthermore, the device case 1 has the leg portion 38 detachably attached to the lower case 3 so that the leg portion 38 can be detached from the lower case 3, when the user grips the grip portion 15 with one hand in this state, the user can satisfactorily grip the grip portion 15 with one hand without being hindered by the leg portion 38.

As illustrated in FIGS. 2, 3, and 16, the device case 1 is configured such that the hand belt 43 can be attached thereto. The hand belt 43 has a belt-like shape and is formed to have a width in the shorter side direction orthogonal to the longitudinal direction that is the same as the length of the interval between the anti-slip portions 42 of the leg portion 38. The hand belt 43 has one end portion to which a mounting bracket 44 is attached and the other end portion folded back at the beam portion 41 of the leg portion 38 and coupled by means of the locking portion 45 such as a hook-and-loop fastener.

In this case, as illustrated in FIGS. 2 and 3, the mounting bracket 44 is detachably mounted on a bracket attachment portion 46 provided on the inclined surface on the side of the scalloped portion 17 in the optical container portion 10 of the lower case 3. As a result, the hand belt 43 is stretched between the optical container portion 10 of the lower case 3 and the leg portion 38, with the mounting bracket 44 on the one end portion attached to the bracket attachment portion 46 of the lower case 3 and the other end portion folded back at the leg portion 38 of the lower case 3 and coupled to the one end portion side by means of the locking portion 45.

Next, an operation of such a portable terminal will be described.

First of all, a case where the side surface trigger keys 11 are attached to both sides of the lower case 3 will be described. In this case, the elastic member 23 attached to the button portion 22 inserted into the button insertion hole 26 of the lower case 3 is disposed in the lower case 3 together with the button portion 22, in a first step.

Specifically, in this first step, the plurality of pressing portions 22b of the button portion 22 are pressed into the bulging portion 23a of the elastic member 23, so that the elastic member 23 is attached to the circumference portion of the button portion 22 by adhesion. In this state, the button portion 22 is inserted into the button insertion hole 26 of the lower case 3 from the inner side of the lower case 3, so that the circumference portion of the elastic member 23 is disposed on the inner surface of the lower case 3.

Then, in a second step, the contact member 24 is guided by the pair of guide portions 25 provided on the inner surface of the lower case 3 and located on both sides of the elastic member 23 to gradually move toward the elastic member 23 to be overlapped with the elastic member 23. Specifically, in the second step, the pair of slide portions 32 of the contact member 24 are guided in the vertical direction by the guide rails 31 of the pair of guide portions 25, so that the electrode surface of the contact body portion 27, inclined with respect to the guide rails 31, overlap with the facing surface of the elastic member 23 inclined with respect to the guide rails 31 while facing the electrode surface.

In this state, the facing surface of the elastic member 23 facing the electrode surface of the contact body portion 27 is inclined at the draft angle of about 4° with respect to the guide rail 31, and the electrode surface of the contact body portion 27 is similarly inclined. Thus, at the guide starting timing when the slide portions 32 of the contact member 24 are guided by the guide rails 31, a clearance is provided between the facing surface of the elastic member 23 and the electrode surface of the contact body portion 27, in a state that the electrode surface of the contact body portion 27 faces the facing surface of the elastic member 23 while being shifted in a surface direction as illustrated in the principle diagrams of FIGS. 10A to 10D.

In this state, during the slide intermediate period in which the pair of slide portions 32 slide while being guided by the guide rails 31, the contact body portion 27 gradually moves toward the elastic member 23 so that the clearance a between the facing surface of the elastic member 23 and the electrode surface of the contact body portion 27 gradually decreases, as illustrated in the principle diagrams in FIGS. 10B and 10D.

Then, at the slide end timing at which the contact member 24 reaches the bottom portion of the lower case 3 with the pair of slide portions 32 slide while being guided by the guide rails 31, the facing surface of the elastic member 23 and the electrode surface of the contact body portion 27 are in pressure contact with each other while facing and overlapping with each other as illustrated in the principle diagrams of FIGS. 10C and 10D.

With this configuration, when the contact member 24 overlaps the elastic member 23, the contact member 24 and the elastic member 23 can be prevented from being damaged by being rubbing against each other. For this reason, the contact electrode 27a of the contact member 24 and the movable contact 23b of the elastic member 23 are not rubbed against each other. Thus, the contact electrode 27a of the contact member 24 will not be damaged, or the movable contact 23b of the elastic member 23 will not be damaged, whereby contact failure does not occur.

In this state, when the contact body portion 27 of the contact member 24 is pressed against the elastic member 23 to be in pressure contact therewith, the cover portion 27b of the contact body portion 27 is fixed while being pressed against the inner surface of the lower case 3 due to elastic force of the elastic member 23 in a state that the pair of contact electrodes 27a of the contact body portion 27 correspond to the plurality of movable contacts 23b of the elastic member 23.

Furthermore, when a rechargeable battery (not illustrated) is put in the battery container portion 13 of the device case 1, the battery cover 12 covering the battery container portion 13 of the lower case 3 is removed, and the rechargeable battery is put into the battery container portion 13. Then, the opening portion 13a of the battery container portion 13 is closed by the battery cover 12. Specifically, the fulcrum protrusion portion 12a of the battery cover 12 is locked to the locking portion 3b provided on the lower portion of the battery container portion 13, and the battery cover 12 is rotated about the fulcrum protrusion portion 12a to close the opening portion 13a of the battery container portion 13.

In this process, the portion of the packing portion 33, provided to the inner frame 33a of the battery cover 12, protruding in an arc shape comes into pressure contact with the inner surface of the outer frame 13b of the opening portion 13a of the battery container portion 13, in a state where the outer surface of the inner frame 33a of the battery cover 12 faces the inner surface of the outer frame 13b of the opening portion 13a of the battery container portion 13. With this configuration, the packing portion 33 of the battery cover 12 waterproofs the opening portion 13a of the battery container portion 13.

Thus, the packing portion 33 is inclined to be more on the inner side of the battery cover 12 at a portion closer to the fulcrum protrusion portion 12a of the battery cover 12. Thus, when the battery cover 12 rotates about the fulcrum protrusion portion 12a to close the opening portion 13a of the battery container portion 13, close contact resistance gradually increases as the battery cover 12 rotates, and as a close contact portion of the packing rubber member 33b with respect to the inner surface of the outer frame 13b provided on the circumference of the opening portion 13a of the battery container portion 13 increases, so that an operation load of the battery cover 12 gradually increases. Thus, an opening/closing operation of the battery cover 12 is improved.

Furthermore, the packing portion 33 is formed in a shape in which the upper portion away from the fulcrum protrusion portion 12a of the battery cover 12 protrudes gently toward the direction away from the fulcrum protrusion portion 12a to be curved. Thus, the packing portion 33 located in a direction away from the fulcrum protrusion portion 12a is gradually comes into pressure contact the inner surface of the outer frame 13b provided on the outer circumference of the opening portion 13a of the lower case 3 corresponding thereto along the curve.

Thus, an excellent closing operation of the battery cover 12 can be achieved, the closing operation of the battery cover 12 is improved, and the opening portion 13a of the battery container portion 13 is reliably and satisfactorily sealed. In this state, the battery cover 12 is attached to the lower case 3 with the upper side edge of the battery cover 12 engaged with the back surface of the lower case 3 by means of the pair of attachment levers 14. Thus, the grip portion 15 is formed in the narrow portion 1b of the device case 1, by the battery cover 12, the lower case 3, and the upper case 2.

Furthermore, the hand belt 43 is attached to the device case 1. In this case, the leg portion 38 that also serves as a belt attachment portion is attached to the grip portion 15 of the device case 1 in advance. In this case, the pair of support pieces 40 of the leg portion 38 are inserted into the plurality of screw holes 35, also serving as the strap holes 37, provided in the inclined portion 15a on the lower portion of the lower case 3 in the grip portion 15.

Then, the engagement protrusion 40b of the hook portion 40a provided on the support piece 40 is pushed by the inner surface of the screw hole 35, so that the hook portion 40a is warped. Furthermore, when the support pieces 40 are inserted into the screw holes 35 of the lower case 3, the hook portions 40a are elastically restored so that the engagement protrusions 40b is detachably engaged with the strap holes 37 positioned on the end surface sides of the lower case 3 orthogonal to the back surface of the lower case 3. In this manner, the leg portion 38 is detachably attached to the screw holes 35.

In this state, the mounting bracket 44 attached to one end portion of the hand belt 43 is attached to the bracket attachment portion 46 of the lower case 3, and the other end portion of the hand belt 43 is inserted between the lower case 3 and the leg portion 38 attached to the lower case 3, and is folded back at the leg portion 38. Then, the other end portion of the hand belt 43 thus folded back is overlapped on the one end portion side of the hand belt 43. Then, one end side and the other end side of the hand belt 43 are coupled to each other by the locking portion 45. As a result, the hand belt 43 is stretched between the optical container portion 10 and the leg portion 38 of the lower case 3.

Next, a case where such a portable terminal is used will be described.

In this case, the user inserts one hand between the device case 1 and the hand belt 43 and holds the device case 1 by gripping the grip portion 15 with the one hand of the user thus inserted. Specifically, the user grips the grip portion 15 with one hand, in the gripping mode in which the thumb F1 of the one hand of the user is provided over the key operation portion 5 for operating the key operation portion 5 with the thumb F1, and other fingers F2 to F5 extending from the side of the device case 1 support the back surface of the device case 1.

In this state, the thumb F1 is placed on the key operation portion 5 on the front surface of the device case 1, and the top portion 16a of the finger resting projection portion 16 having a bulging shape is provided between the index finger F2 and the middle finger F3 of the gripping hand of the user. In this state, the cushion of the index finger F2 is pressed against the first finger resting region 18 that is the first inclined surface of the finger resting projection portion 16 of the battery cover 12 located on the back surface side of the device case 1. The cushion of each of the other fingers F3 to F5 is arranged on the second finger resting region 19 of the finger resting projection portion 16.

In this state, the cushion of the index finger F2 of the gripping hand of the user is pressed against the inclined surface of the first finger resting region 18 of the finger resting projection portion 16 of the battery cover 12, in the gripping mode in which the thumb F1 of the one hand of the user is provided over the key operation portion 5 for operating the key operation portion 5 with the thumb F1, and other fingers F2 to F5 extending from the side of the device case 1 support the back surface of the device case 1. In this state, the index finger F2 of the gripping hand is guided by the first finger resting region 18 toward the lower portion side, that is, the side of the gripping hand of the user.

In this case, the cushion of the index finger F2 is pressed against the inclined surface of the first finger resting region 18 in the finger resting projection portion 16 of the battery cover 12, and is pressed against the first finger resting region 18 while being naturally bent along the curvature, upon being guided toward the lower portion side of the device case 1, that is, the side of the gripping hand of the user. At this time, the index finger F2 of the gripping hand of the user is disposed between the first finger resting region 18 and the button portion 20a of the lower surface trigger key 20. In this state, the button portion 20a of the lower surface trigger key 20 is not operated by the index finger F2 of the gripping hand of the user.

At this time, in the gripping mode in which the thumb F1 of the user is provided over the key operation portion 5 for operating the key operation portion 5 with the thumb F1 and the other fingers F2 to F5 extending from the side of the device case 1 support the back surface of the device case 1, the cushions of the other fingers F3 to F5 of the gripping hand of the user are pressed on the second finger resting region 19 of the finger resting projection portion 16. In this state, the fingers F3 to F5 are arranged side by side in a state of being naturally bent along the curvature of the second finger resting region 19.

Thus, the middle finger F3 to the little finger F5 are arranged side by side in the second finger resting region 19 while being naturally bent to be wrapped around the second finger resting region 19 of the finger resting projection portion 16, in a state where the top portion 16a of the finger resting projection portion 16 having a bulging shape is arranged between the index finger F2 and the middle finger F3 of the gripping hand of the user. Thus, the fingers F3 to F5 are satisfactorily arranged in a stable state along the curved surface of the second finger resting region 19. As a result, the user can reliably and satisfactorily grip the grip portion 15 of the device case 1 with one hand.

As described above, when the user grips the grip portion 15 of the device case 1, the grip portion 15 of the device case 1 can be reliably and satisfactorily held by the gripping hand of the user with the gripping hand of the user fitting to the grip portion 15, because the grip portion 15 is provided in the narrow portion 1b of the device case 1 and is formed to have a curved shape by gently curving toward the back surface side from both side portions of the grip portion 15 to protrude.

Furthermore, when the user grips the grip portion 15 of the device case 1 with one hand, the user can reliably and satisfactorily grip the grip portion 15 of the device case 1 with the right hand or the left hand, because the grip portion 15 is formed to be symmetrical in the left and right direction about the center position in the lateral direction of the device case 1. Also in this case, the gripping hand of the user fits the grip portion 15 when the user grips the grip portion 15 of the device case 1 with one hand, because the lower surface side of the grip portion 15 is formed to be in a curved shape by gently curving to protrude.

When the user grips the grip portion 15 of the device case 1 in this way, the thumb F1 is placed on the key operation portion 5 without blocking the display portion 4. Thus, the user can satisfactorily operate the key operation portion 5 by moving the thumb F1 freely on the key operation portion 5, can move the index finger F2 to the lower surface trigger key 20 to perform a key operation on the lower surface trigger key 20, and move the index finger F2 to the side surface of the device case 1 to perform a key operation on the side surface trigger key 11, while watching information displayed on the display portion 4.

In this case, when the user grips the grip portion 15 of the device case 1 and operates any of the upper surface trigger key 5a, the lower surface trigger key 20, or the side surface trigger key 11 to perform a turn ON operation, the optical reading unit 6 provided on the back surface of the wide portion 1a of the device case 1 is driven, the laser reading unit 7 causes a laser beam to be emitted to the outside of the device case 1 from the first window portion 10d provided to the first surface 10a of the optical container portion 10, and reads the reflected light of the laser beam, to read a barcode of an item and the like.

At this time, when the mode is an image capturing mode, the image capturing unit 8 of the optical reading unit 6 captures an image of the item read by the laser reading unit through the second window portion 10e provided on the second surface 10b of the optical container portion 10. At this time, the display surface of the display portion 4 provided in the upper case 2 and the second surface 10b of the optical container portion 10 are provided substantially in parallel with each other, and thus the image capturing unit 8 captures the image of the item with the image capturing unit 8 being oriented toward the item that is an image capturing target and with the display portion 4 displaying the an image, whereby the image can be satisfactorily captured with the user watching the image thus displayed.

In this case, when the button portion 20a of the lower surface trigger key 20 is pressed by user with the index finger F2 of the hand gripping the grip portion 15, the button portion 20a makes a bulging portion of the elastic sheet 20b elastically deform to make a movable contact point of the elastic sheet 20b come into contact with a fixed contact point of the switch substrate 20c, so that a switch signal is output.

Furthermore, when the user operates the side surface trigger key 11 with the index finger F2 of the hand gripping the grip portion 15, the side surface trigger key 11 can be satisfactorily operated by the index finger F2, because the side surface trigger keys 11 are each inclined at a predetermined inclination angle in both side portions of the wide portion 1a of the device case 1.

The button portion 22 of the side surface trigger key 11 is arranged in an inclined state at a predetermined inclination angle, with the front surface of the device case 1 serving as a reference surface, so that the distance with respect to the reference surface of the device case 1 in a thickness direction increases as it gets farther from the side of the grip portion 15. Thus, the index finger F2 extended to be separated from the first finger resting region 18, can be used for satisfactorily operate the button portion 22 of the side surface trigger key 11.

Thus, the index finger F2 can be reliably and satisfactorily arranged on the button portion 22 of the side surface trigger key 11, when the index finger F2 of the user pressed against the first finger resting region 18 is separated from the first finger resting region 18 to be extended, in the state where the user grips the grip portion 15 in the first gripping way, in the gripping mode in which the thumb F1 of the user is provided over the key operation portion 5 and the other fingers F2 to F5 extending from the side of the device case 1 support the back surface of the device case 1.

In this state, when the button portion 22 of the side surface trigger key 11 is pressed and operated by the index finger F2, the plurality of pressing portions 22b of the button portion 22 press and make the bulging portion 23a of the elastic member 23 elastically deform. As a result, the plurality of movable contacts 23b in the bulging portion 23a elastically deformed come into contact with the pair of comb-shaped contact electrodes 27a provided to the contact body portion 27 of the contact member 24. Thus, the pair of contact electrodes 27a become conductive so that a switch signal is output to the circuit board 30.

Next, a case where this portable terminal is used while being placed on the placement surface T such as a table top will be described.

In this case, first of all, the device case 1 to which the hand belt 43 is attached is placed on the placement surface T such as a tabletop. At this time, as illustrated in FIG. 16, the lower case 3 is placed on the placement surface T with the display portion 4 and the key operation portion 5 of the upper case 2 facing upward.

As a result, the second surface 10b of the optical container portion 10 provided on one end side of the lower case 3 and the leg portion 38 attached to the other end side of the lower case 3 are placed on the placement surface T. In this state, even if the hand belt 43 is attached to the device case 1, the device case 1 is disposed on the placement surface T without being hindered by the hand belt 43.

Specifically, the hand belt 43 has the mounting bracket 44 on one end attached to the bracket attachment portion 46 provided on the inclined surface on the side of the scalloped portion 17 of the optical container portion 10 of the lower case 3, and has the other end portion provided between the anti-slip portions 42 of the leg portion 38, with the outer circumference surfaces of the anti-slip portions 42 protruding from the surface of the hand belt 43. Thus, the pair of anti-slip portions 42 of the leg portion 38 are in contact with and placed on the placement surface T, and the boundary portion 10c on one side of the second surface 10b of the optical container portion 10 is in contact and placed on the placement surface T.

Thus, the device case 1 is arranged on the placement surface T without being hindered by the hand belt 43. In this case, even when only the hand belt 43 is detached from the device case 1 as illustrated in FIG. 17, in the state where the leg portion 38 is attached to the device case 1, the placement as described above can be achieved.

Thus, the device case 1 is satisfactorily and stably placed on the placement surface T. That is, even if the grip portion 15 of the device case 1 is formed in a curved shape to be easily gripped by the user, the device case 1 is prevented from rolling on the placement surface T by the leg portion 38 attached to the grip portion 15, so that the device case 1 can be satisfactorily and reliably placed on the placement surface T. Thus, in this state, the key operation portion 5 can be satisfactorily operated while the information displayed on the display portion 4 is being viewed.

In this case, the leg portion 38 includes the pair of support pieces 40 detachably attached to the plurality of screw holes 35 provided on both sides of the lower case 3 along the short direction (width direction) orthogonal to the longitudinal direction thereof, and the beam portion 41 bridging between the pair of support pieces 40 to be provided over the top of the inclined portion 15a in the shorter side direction (width direction) orthogonal to the longitudinal direction of the lower case 3. The beam portion 41 of the leg portion 38 is placed on the placement surface T so that the device case 1 is reliably, satisfactorily, and stably placed on the placement surface T.

Further, in this state, the leg portion 38 is attached to the lower case 3, so that the boundary portion 10c of the optical container portion 10 and the anti-slip portion 42 of the leg portion 38 are arranged to be in contact with the placement surface T. In this state, the device case 1 is placed on the placement surface T, in a state that the reference portion of the second surface 10b that is a planer region is not in contact with the placement surface T, and an end portion of the second surface 10b of the optical container portion 10 on the opposite side of the first surface 10a, that is, an end on the side opposite to the boundary portion 10c is separated from the placement surface T. Thus, a gap is provided between the reference portion of the second surface 10b of the device case 1 and the placement surface T.

Thus, the microphone sound collection hole 10f provided in the reference portion of the second surface 10b, which is a planer region of the optical container portion 10, is not blocked by the placement surface T, whereby sound can be satisfactorily captured by the microphone. Also when a sound emission hole for a speaker is provided instead of the sound collection hole 10f for the microphone, the sound emission hole is not blocked by the placement surface T, so that the sound from the speaker can be satisfactorily emitted.

On the other hand, when the device case 1 is placed on the placement surface T with the hand belt 43 and the leg portion 38 detached, as illustrated in FIG. 18, the end portion of the second surface 10b of the optical container portion 10 on the side opposite to the boundary portion 10c and the end portion on the side of the inclined portion 15a on the lower side of the lower case 3 are placed on the placement surface T, with the reference portion of the second surface 10b that is a planer region not being in contact with the placement surface T.

In this state, the device case 1 is placed on the placement surface T, in a state where the end portion of the second surface 10b located on the side of the first surface 10a, that is, the boundary portion 10c, with respect to the reference portion of the second surface 10b that is the planer region of the optical container portion 10, separated from the placement surface T. Thus, a gap is provided between the reference portion of the second surface 10b of the device case 1 and the placement surface T.

Thus, also in this state, the microphone sound collection hole 10f provided in the reference portion of the second surface 10b, which is a planer region of the optical container portion 10, is not blocked by the placement surface T, whereby sound can be satisfactorily captured by the microphone. Also when a sound emission hole for a speaker is provided instead of the sound collection hole 10f for the microphone, the sound emission hole is not blocked by the placement surface T, so that the sound from the speaker can be satisfactorily emitted.

Thus, in this device case 1, the portion of the second surface 10b to be in contact with the placement surface T, with respect the reference portion of the second surface of the optical container portion 10, is different between the case where the leg portion 38 is attached so that the optical container portion 10 and the leg portion 38 are placed on the placement surface T and a case where the leg portion 38 is detached from the device case 1 and the optical container portion 10 and the other end portion of the device case 1 are placed on the placement surface T.

Thus, a gap can be reliably and satisfactorily provided between the second surface 10b of the device case 1 and the placement surface T, only with the second surface 10b being inclined oppositely with respect to the reference portion, with respect to the placement surface T, between the case where the leg portion 38 is attached to the device case 1 and the case where the leg portion 38 is detached from the device case 1. Thus, the sound can be satisfactorily captured by the microphone and the sound of the speaker can be emitted satisfactorily, regardless of whether the leg portion 38 is attached or detached.

As described above, this portable terminal includes the device case 1, the battery cover 12, and the packing portion 33. The device case 1 is provided with the opening portion 13a of the battery container portion 13. The battery cover 12 includes the fulcrum protrusion portion 12a having one end provided with a fulcrum portion engaged with the device case 1, and rotates about this fulcrum protrusion portion 12a to close the opening portion 13a of the battery container portion 13 in an openable manner. The packing portion 33 is provided in an inclined manner to more on the inner side of the battery cover 12 at a portion closer to the fulcrum protrusion portion 12a of the battery cover 12, and comes into pressure contact with the edge portion of the opening portion 13a when the battery cover 12 closes the opening portion 13a of the battery container portion 13. Thus, the operability at the time of opening/closing the battery cover 12 can be improved while guaranteeing the waterproofness.

Thus, in this portable terminal, the packing portion 33 is inclined to be more on the inner side of the battery cover 12 at a portion closer to the fulcrum protrusion portion 12a of the battery cover 12. Thus, when the battery cover 12 rotates about the fulcrum protrusion portion 12a to close the opening portion 13a of the battery container portion 13, close contact resistance gradually increases as the battery cover 12 rotates, and as a close contact portion of the packing portion 33 with respect to the edge portion of the opening portion 13a of the battery container portion 13 increases, so that an operation load of the battery cover 12 gradually increases meaning that strong force is not required. Thus, an excellent closing operation of the battery cover 12 can be achieved and the operability of the closing operation of the battery cover 12 can be improved. Furthermore, the opening portion 13a of the battery container portion 13 can be reliably and satisfactorily sealed.

Further, in this portable terminal, the packing portion 33 includes the inner frame 33a that is a support frame provided to the battery cover 12 over the entire circumference of the opening portion 13a of the battery container portion 13 of the device case 1, and the silicone packing rubber member 33b integrally provided with the inner frame 33a to cover the inner frame 33a. Thus, when the battery cover 12 closes the opening portion 13a of the battery container portion 13, the inner frame 33a of the packing portion 33 can reliably and satisfactorily make the packing rubber member 33b to be in pressure contact with the edge portion of the opening portion 13a of the battery container portion 13.

In this case, the inclined portion 15a that protrudes toward the battery cover 12 is provided on one end side of the device case 1 on the side of the fulcrum protrusion portion 12a of the battery cover 12, and the device case 1 includes the outer frame 13b that is provided along the inner circumference of the packing portion 33 of the battery cover 12 and serves as a pressure contact frame having a side surface to which the packing rubber member 33b of the packing portion 33 comes into pressure contact. Thus, when the battery cover 12 closes the opening portion 13a of the battery container portion 13, the inner frame 33a of the packing portion 33 can reliably and satisfactorily make the packing rubber member 33b come into pressure contact with the side surface of the outer frame 13b of the device case 1.

In this case, the packing portion 33 is formed so as to have a shape that is gently protruding and curving in the direction away from the fulcrum protrusion portion 12a at the end portion away from the fulcrum protrusion portion 12a. Thus, the packing portion 33 can smoothly and reliably come into pressure contact at the end portion away from the fulcrum protrusion portion 12a of the battery cover 12, and this also contributes to guarantee the waterproofness.

Figure 19A:
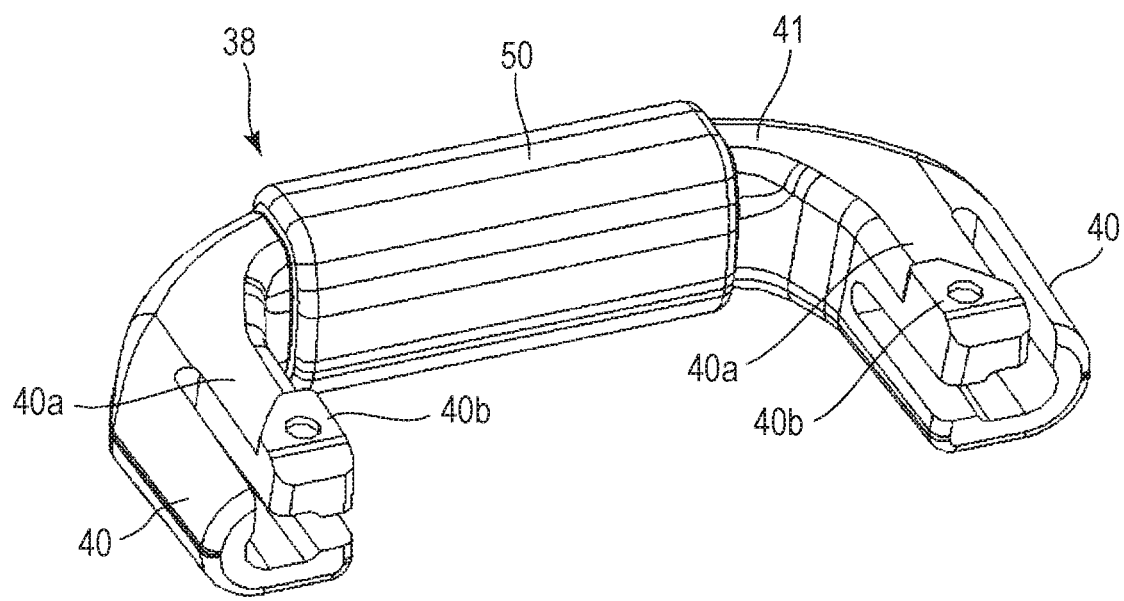
FIG. 19A is an enlarged perspective view of a modification of the leg portion illustrated in FIG. 14.
Figure 19B:
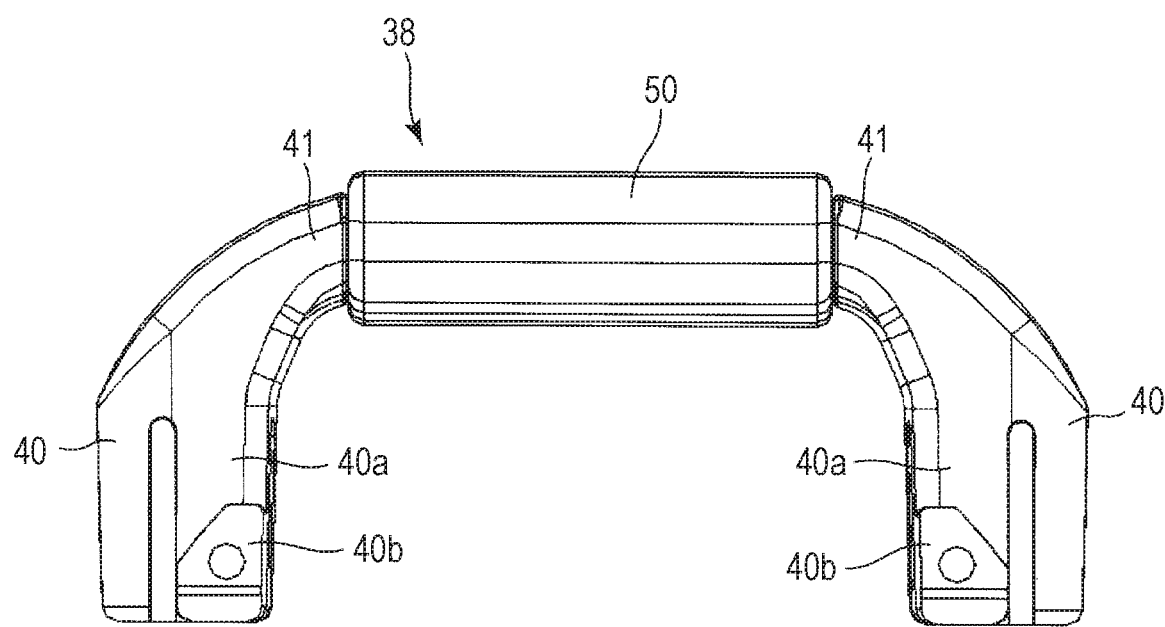
FIG. 19B is an enlarged front view of the modification of the leg portion illustrated in FIG. 14.

In the above-described embodiment, the case is described where the anti-slip portions 42 are provided on the beam portion 41 of the leg portion 38 on both sides of the hand belt 43 in the shorter side direction. However, the present invention is not limited to this. For example, as in a modification illustrated in FIGS. 19A and 19B, a structure in which an anti-slip portion 50 is provided entirely over the beam portion 41 of the leg portion 38 may be employed. With this configuration, the anti-slip portion 50 has a larger area to be into contact with the placement surface T, so that the leg portion 38 is further less likely to slide on the placement surface T.

In the above-described embodiment, the case where the slide portion 32 of the side surface trigger key 11 slides in the vertical direction along the guide rail 31 while sandwiching the guide rail 31 is described. However, the present invention is not limited to this. For example, the guide rail provided in the lower case 3 may guide a slide portion provided to the contact member 24 while sandwiching the slide portion.

Furthermore, in the above-described embodiment, the electrode surface of the contact member 24 of the side surface trigger key 11 and the facing surface of the elastic member 23 facing the electrode surface are inclined with respect to the lower case 3, and the guide rail 31 that guides the slide portion 32 of the contact member 24 is vertically with respect to the lower case 3. However, the present invention is not limited to this. For example, the electrode surface of the contact member 24 of the side surface trigger key 11 and the facing surface of the elastic member 23 may be vertically provided to the lower case 3, and the guide rail 31 that guides the slide portion 32 of the contact member 24 may be inclined with respect to the lower case 3.

Furthermore, in the above-described embodiment, the case is described where the opening portion 13a of the battery container portion 13 of the device case 1 and the battery cover 12 that closes the opening portion 13a are waterproofed. However, the present invention is not limited to this and can be applied to a structure for waterproofing the upper case 2 and the lower case 3 of the device case 1 for example, so that a waterproof case can be obtained.

One embodiment of the present invention is described above, but the present invention is not limited to this, and includes the invention described in the claim and a range of its equivalents.

What is claimed is:

1. An electronic device comprising:
   a first case provided with an opening portion;
   a second case that has one end portion provided with a fulcrum portion engaged with the first case and that rotates about the fulcrum portion to close the opening portion in an openable manner, and
   a packing portion that is provided to be inclined to be more on an inner side of the second case at a portion closer to the fulcrum portion of the second case, and that comes into pressure contact with an edge portion of the opening portion when the second case closes the opening portion,
   wherein the packing portion includes, in the second case, a support frame provided over an entire circumference of the opening portion of the first case and a packing rubber member that is made of silicone and is integrally provided with the support frame to cover the support frame.

2. The electronic device according to claim 1, wherein, on one end portion side of the first case on a side of the fulcrum portion of the second case, an inclined portion protruding toward a side of the second case is provided.

3. The electronic device according to claim 1, wherein the first case includes a pressure contact frame that has a side surface to which the packing rubber member comes into pressure contact, and that is provided along an inner circumference of the packing portion of the second case.

4. The electronic device according to claim 3, wherein the packing portion is formed to have a shape gently protruding and curving in a direction away from the fulcrum portion, at an end portion away from the fulcrum portion.

5. The electronic device according to claim 1, wherein the second case comprises a battery cover that closes an opening portion of a battery container portion provided in the first case, in an openable manner.

6. The electronic device according to claim 1, wherein the packing portion is formed to have a continuous pentagonal shape.

7. The electronic device according to claim 1, wherein the fulcrum portion is formed as a protruding portion that is insertable into a locking recess provided in the first case.

8. An electronic device comprising:
   a first case provided with an opening portion;
   a second case that has one end portion provided with a fulcrum portion engaged with the first case and that rotates about the fulcrum portion to close the opening portion in an openable manner, and
   a packing portion that is provided to be inclined to be more on an inner side of the second case at a portion closer to the fulcrum portion of the second case, and that comes into pressure contact with an edge portion of the opening portion when the second case closes the opening portion,
   wherein the packing portion is provided to be inclined to be more on a side opposite to the first case at a portion closer to the fulcrum portion.

9. An electronic device comprising:
   a first case provided with an opening portion;
   a second case that has one end portion provided with a fulcrum portion engaged with the first case and that rotates about the fulcrum portion to close the opening portion in an openable manner, and
   a packing portion that is provided to be inclined to be more on an inner side of the second case at a portion closer to the fulcrum portion of the second case, and that comes into pressure contact with an edge portion of the opening portion when the second case closes the opening portion,
   wherein the packing portion is provided to be inclined to be more on a side opposite to a depth direction of the opening portion at a portion closer to the fulcrum portion.

10. A waterproof case comprising:

a first case provided with an opening portion;

a second case that has one end portion provided with a fulcrum portion engaged with the first case and that rotates about the fulcrum portion to close the opening portion in an openable manner, and a packing portion that is provided to be inclined to be more on an inner side of the second case at a portion closer to the fulcrum portion of the second case, and that comes into pressure contact with an edge portion of the opening portion when the second case closes the opening portion, wherein the packing portion is provided to be inclined to be more on a side opposite to a depth direction of the opening portion at a portion closer to the fulcrum portion.

* * * * *